United States Patent
Oshima

(10) Patent No.: US 8,309,425 B2
(45) Date of Patent: Nov. 13, 2012

(54) METHOD OF MANUFACTURING SEMICONDUCTOR DEVICE

(75) Inventor: Hiromitsu Oshima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/013,350

(22) Filed: Jan. 25, 2011

(65) Prior Publication Data

US 2011/0189830 A1    Aug. 4, 2011

(30) Foreign Application Priority Data

Jan. 29, 2010    (JP) ................................. 2010-019659

(51) Int. Cl.
*H01L 21/76* (2006.01)
(52) U.S. Cl. . 438/424; 438/173; 438/192; 257/E21.553; 257/E21.683
(58) Field of Classification Search ............. 438/424, 438/173, 192; 257/E21.553, E21.683
See application file for complete search history.

(56) References Cited

U.S. PATENT DOCUMENTS

| 2007/0020879 A1* | 1/2007 | Baek et al. .......... 438/424 |
| 2007/0210403 A1* | 9/2007 | Sandhu .............. 257/499 |
| 2008/0121961 A1* | 5/2008 | Schloesser .......... 257/302 |

FOREIGN PATENT DOCUMENTS

| JP | 2005-064500 | 3/2005 |
| JP | 2007-027753 | 2/2007 |
| JP | 2007-305827 | 11/2007 |

* cited by examiner

*Primary Examiner* — Julia Slutsker
(74) *Attorney, Agent, or Firm* — Young & Thompson

(57) ABSTRACT

A method of manufacturing a semiconductor device may include, but is not limited to the following processes. A semiconductor substrate is prepared. The semiconductor substrate has a first region and a second region other than the first region. A first mask is formed over the first region. The first mask has a first line-and-space pattern extending in a first direction. A first removing process is performed. The first removing process selectively removes the first region with the first mask to form a first groove extending in the first direction. The first removing process removes an upper part of the second region while a remaining part of the second region having a first surface facing upward. The bottom level of the first groove is higher than the level of the first surface.

18 Claims, 23 Drawing Sheets

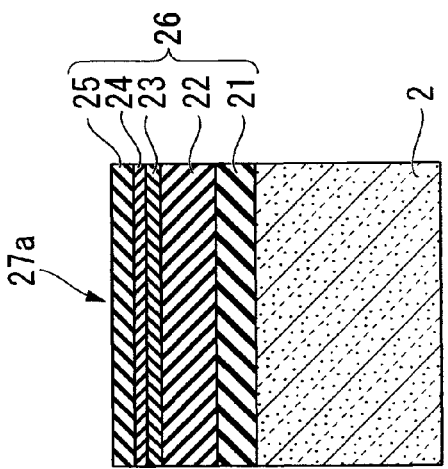
FIG. 3C
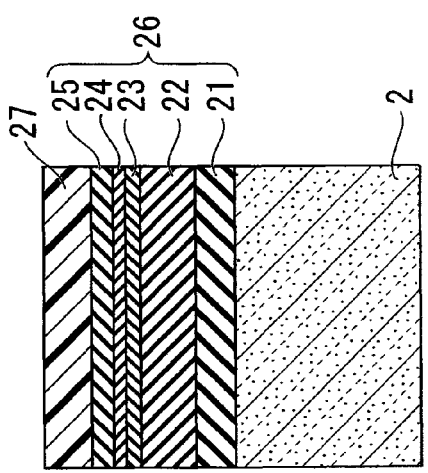
FIG. 3B
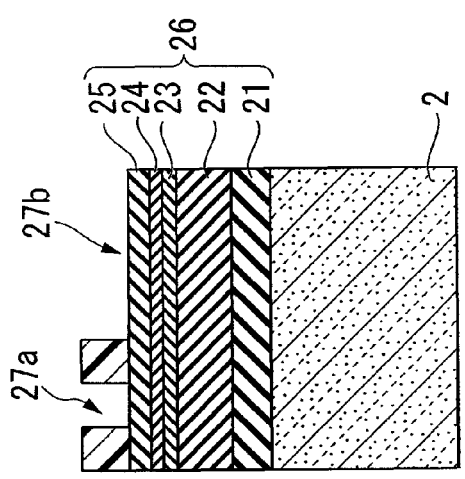
FIG. 3E
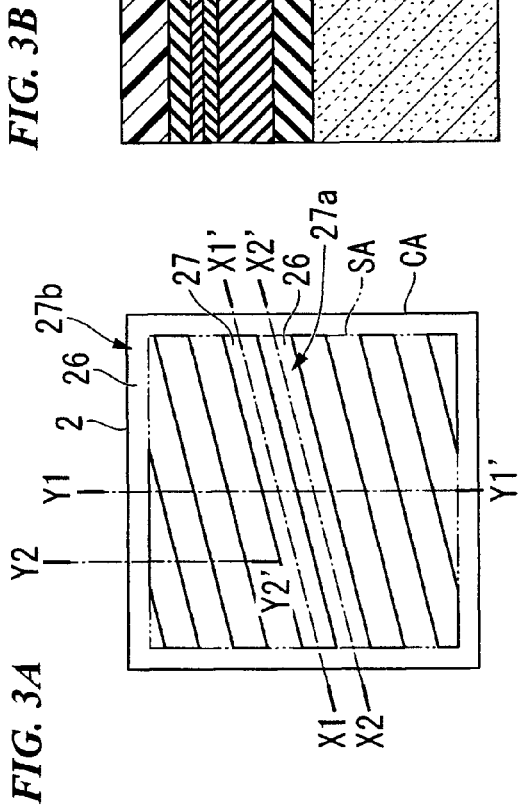
FIG. 3A
FIG. 3D

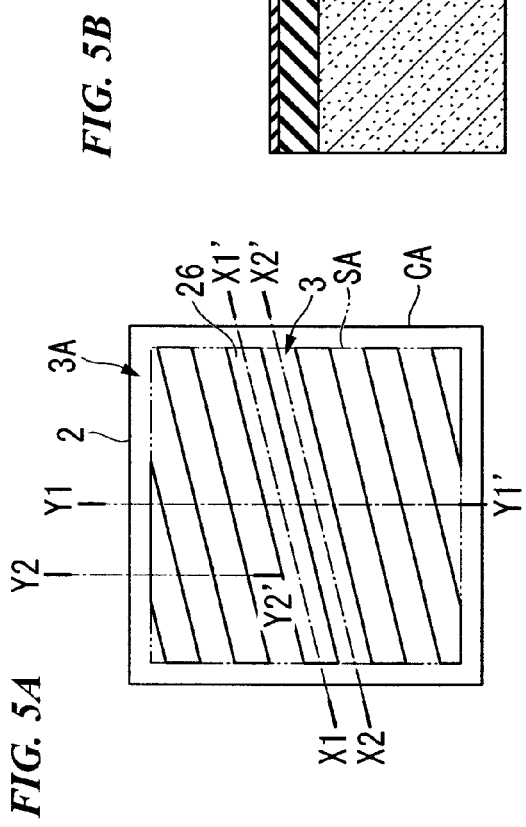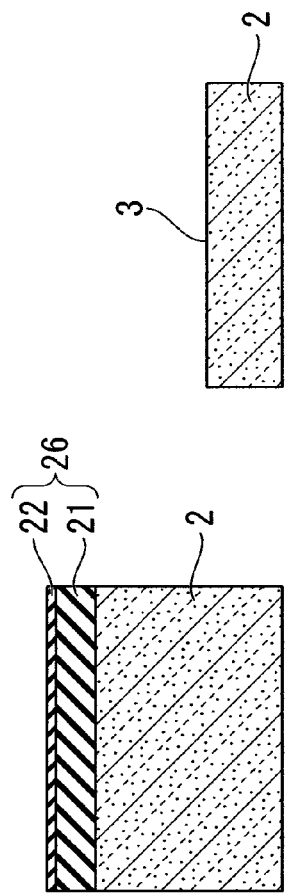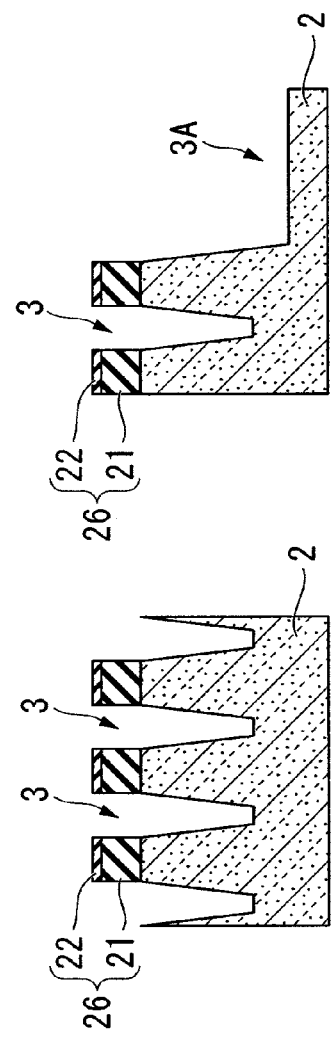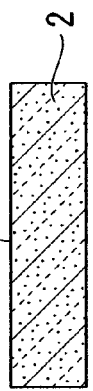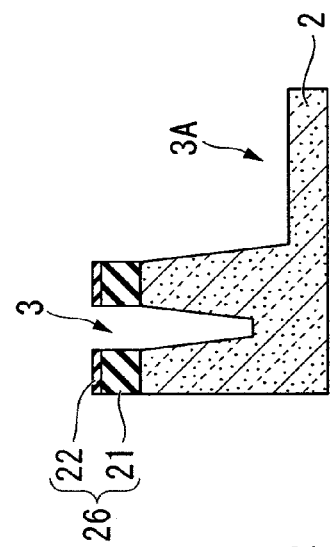

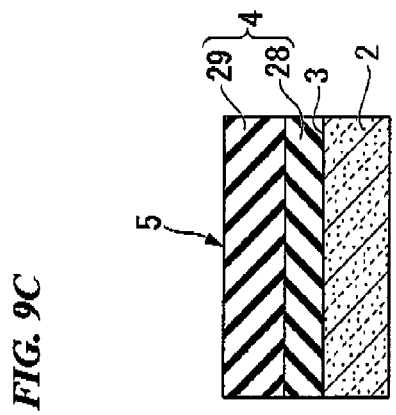
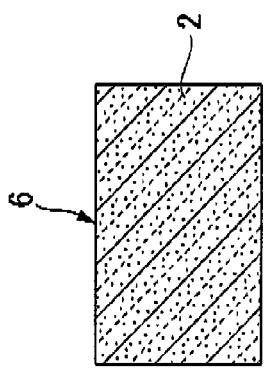
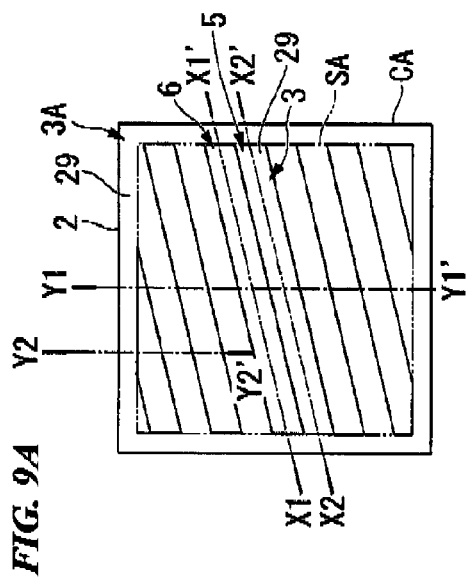
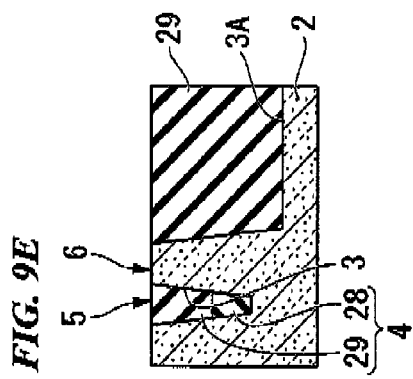
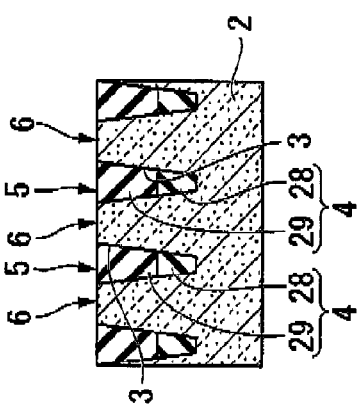

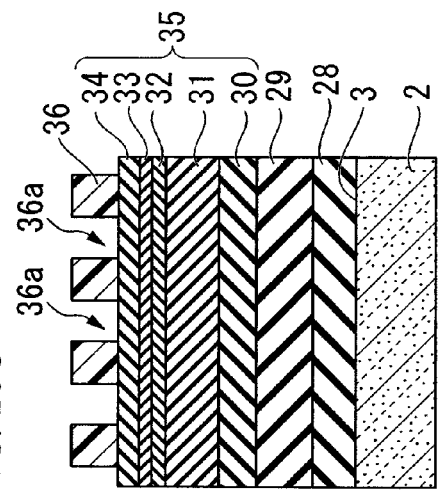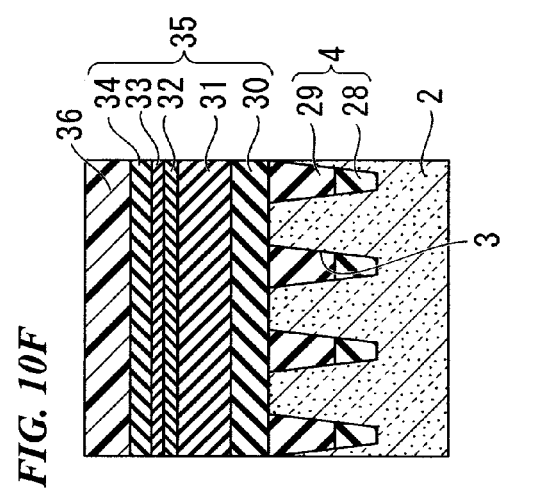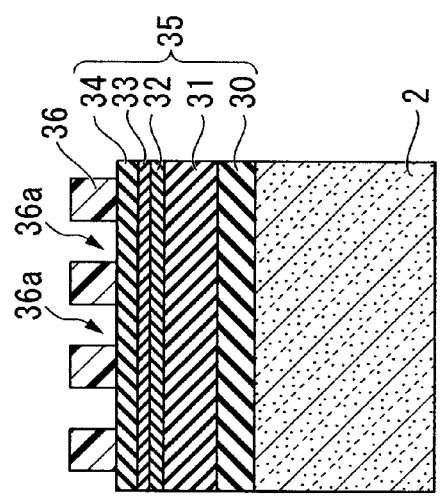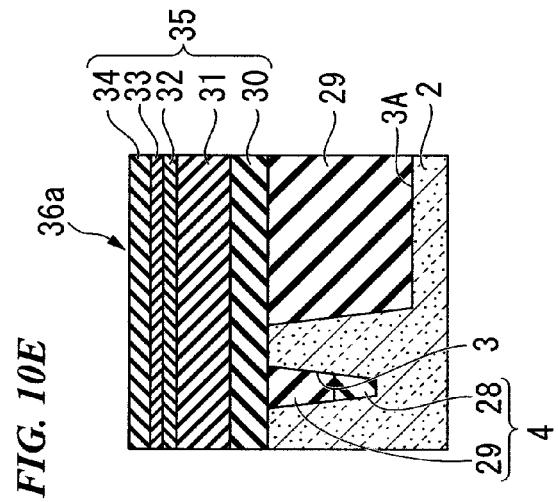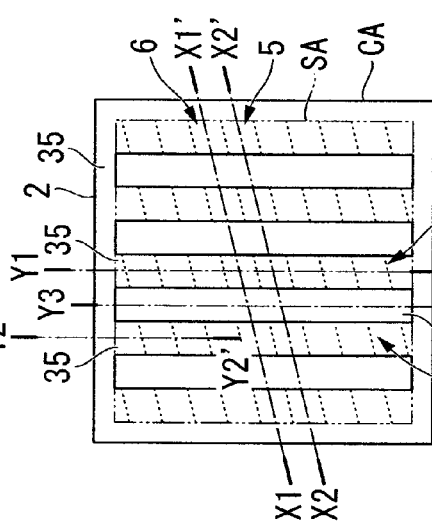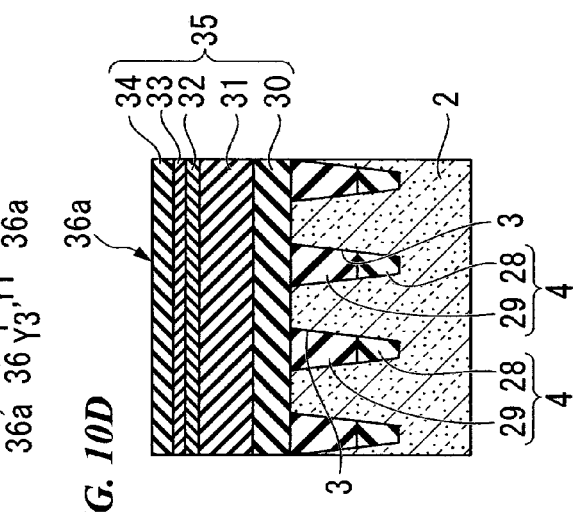

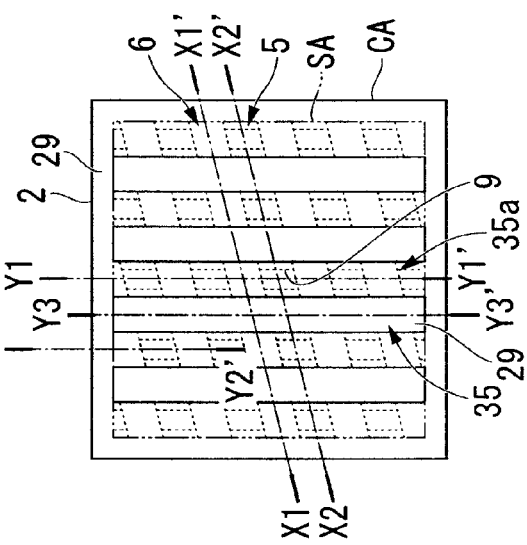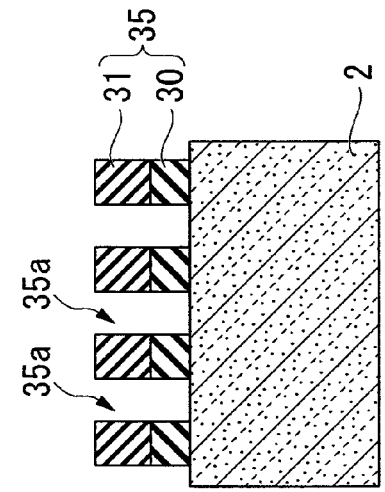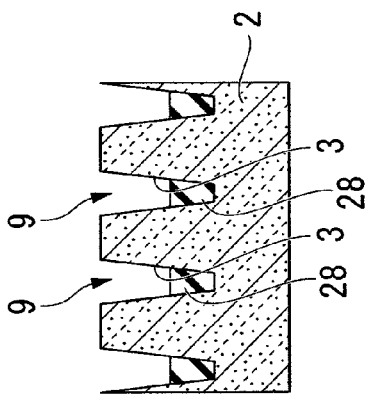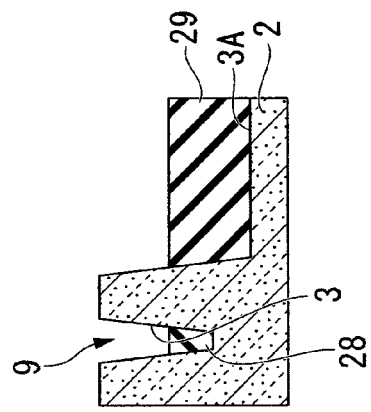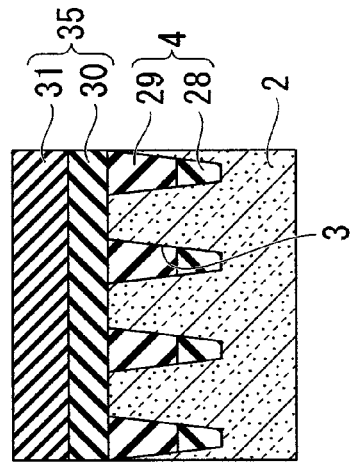

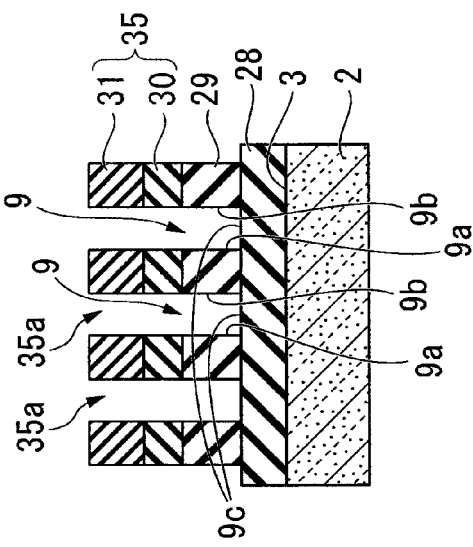
FIG. 13A
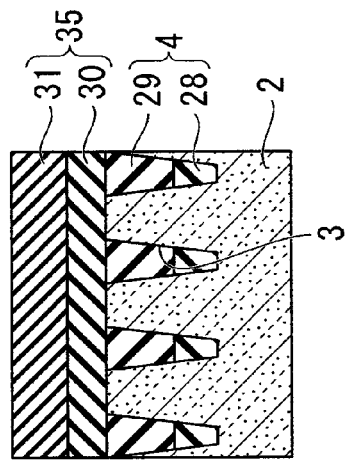
FIG. 13B
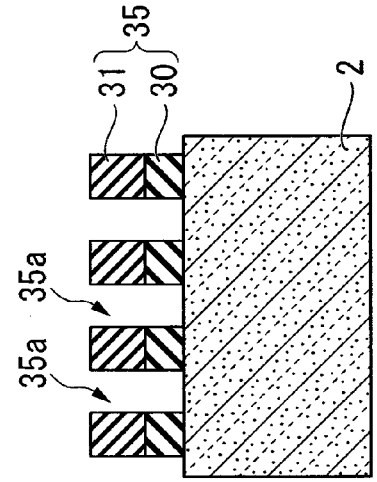
FIG. 13C
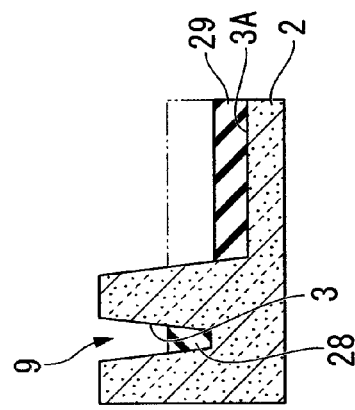
FIG. 13D
FIG. 13E
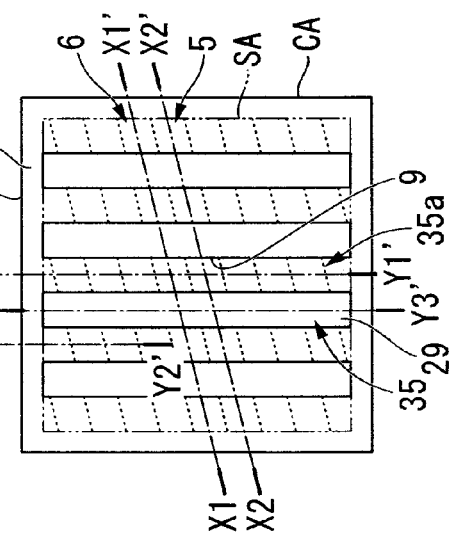
FIG. 13F
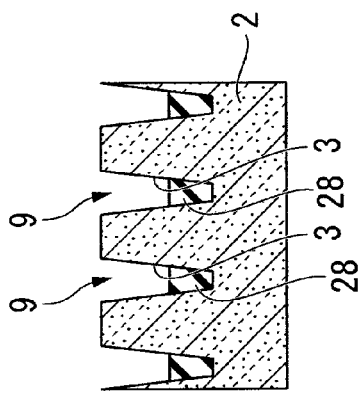

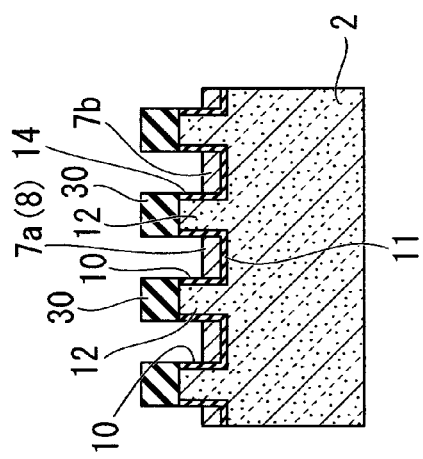
FIG. 16A
FIG. 16B
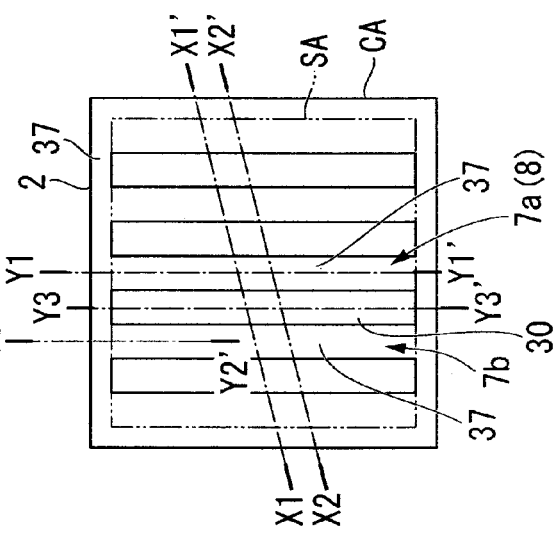
FIG. 16C
FIG. 16D
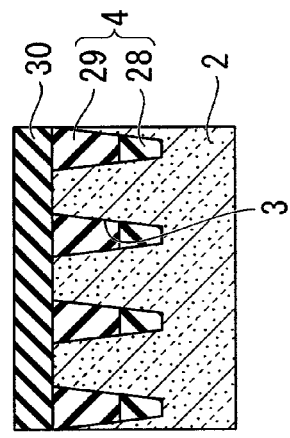
FIG. 16E
FIG. 16F
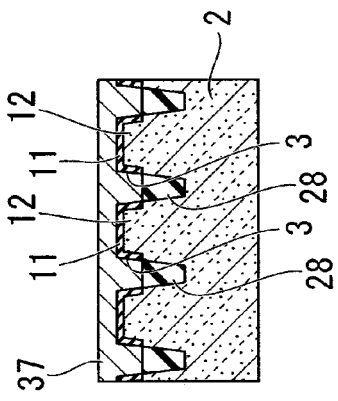

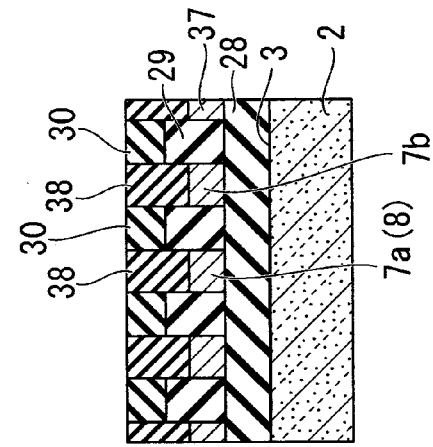
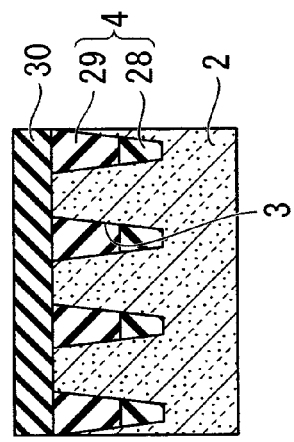
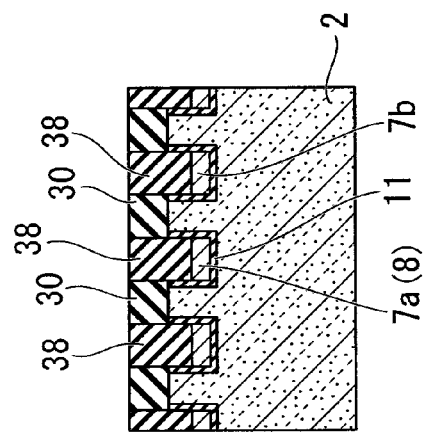
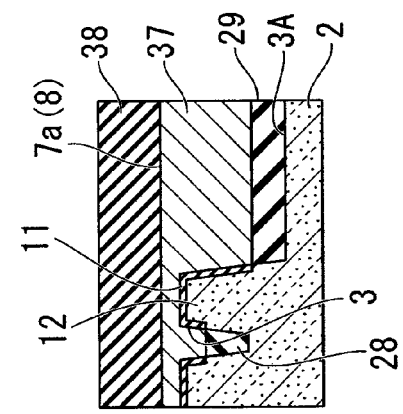
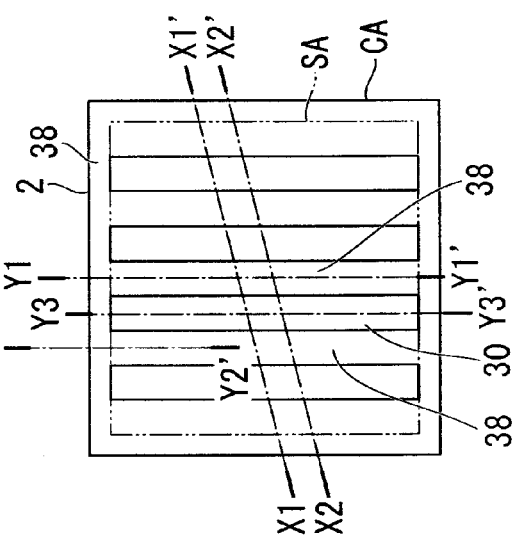
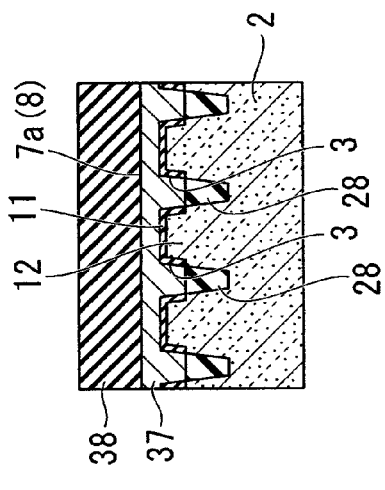

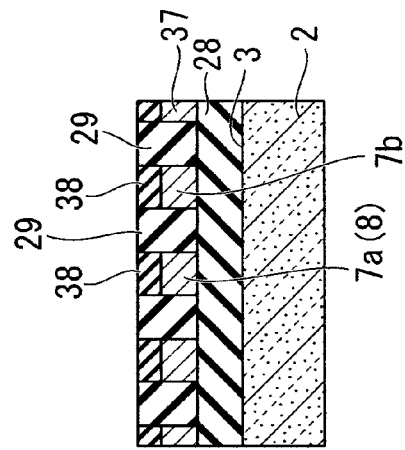
FIG. 19C
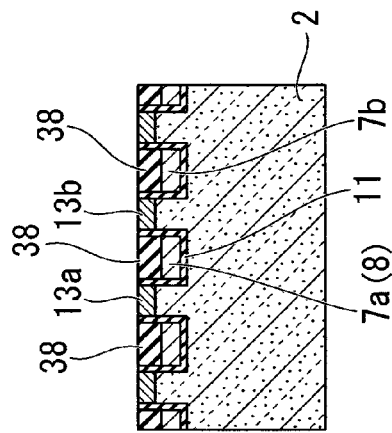
FIG. 19B
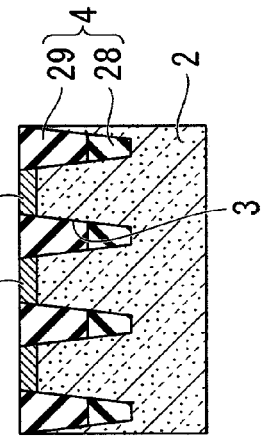
FIG. 19F
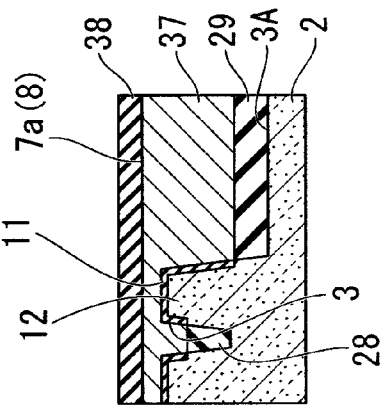
FIG. 19E
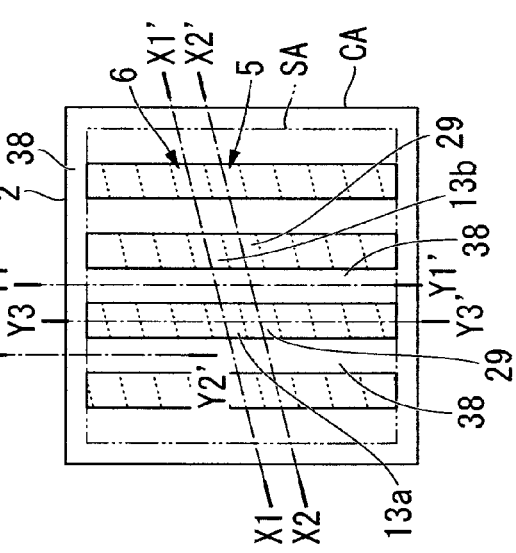
FIG. 19A
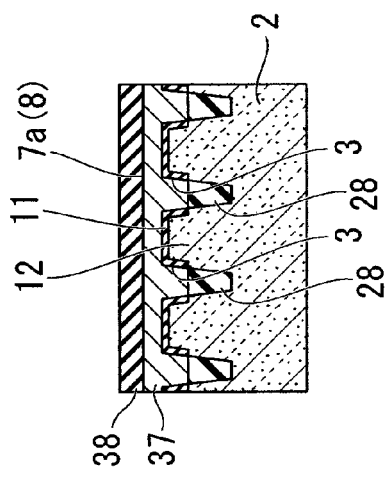
FIG. 19D

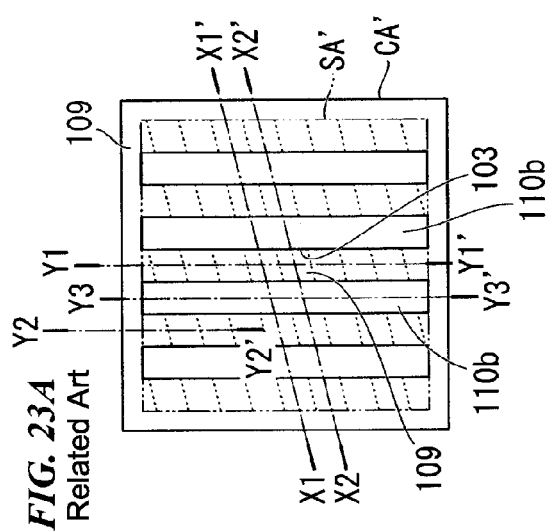
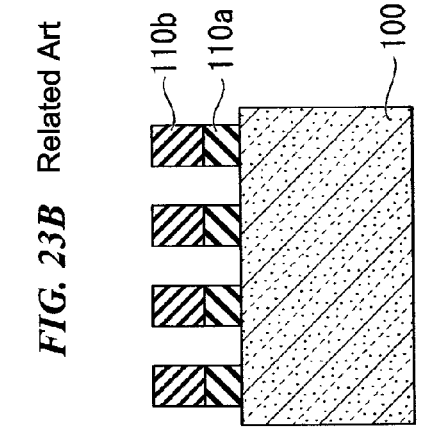
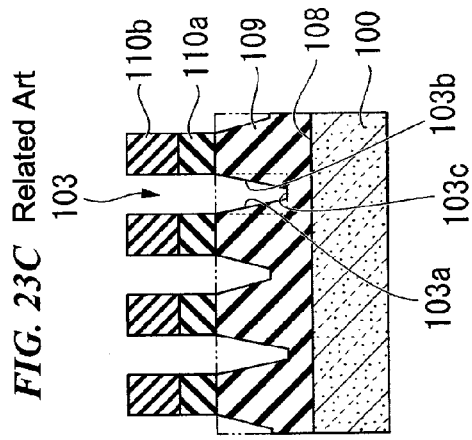
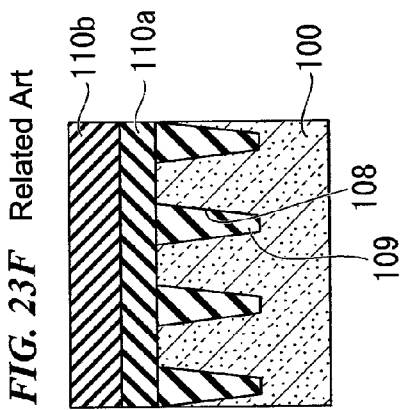
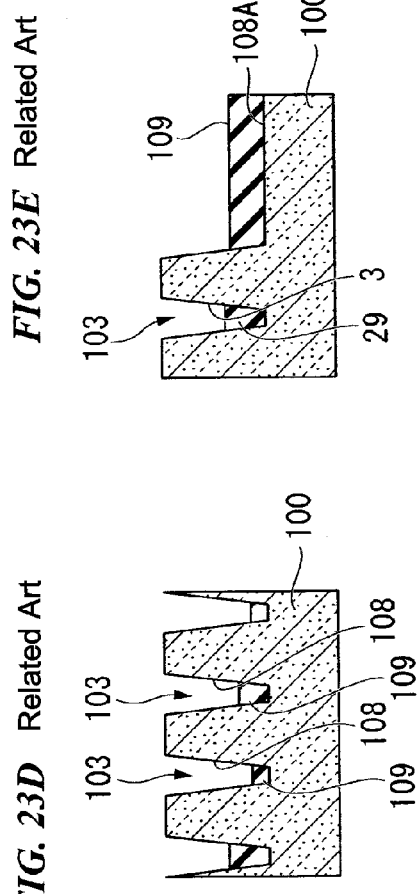
FIG. 23A Related Art
FIG. 23B Related Art
FIG. 23C Related Art
FIG. 23D Related Art
FIG. 23E Related Art
FIG. 23F Related Art

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No. 2010-019659, filed Jan. 29, 2010, the content of which is incorporated herein by reference.

2. Description of the Related Art

Recently, with the miniaturization of semiconductor elements, the size of transistors has been reduced. The reduction in size of the transistors causes the short channel effect. In a case of a DRAM (Dynamic Random Access Memory), the channel lengths of transistors are reduced along with a reduction in the size of memory cells, thereby decreasing performance of the transistor, and therefore degrading retention and write characteristics of memory cells.

To solve the above problems, Japanese Patent Laid-Open Publication No. 2005-064500, No. 2007-027753, and No. 2007-305827 disclose a trench FET (Field Effect Transistor) and a fin FET. Specifically, in the case of the trench FET, a groove is formed in a semiconductor substrate. A gate electrode is formed so as to fill the groove through the gate insulating film. Thus, a three-dimensional channel structure is achieved.

On the other hand, in the case of the fin FET, a silicon fin portion, which functions as a channel, is formed on a semiconductor substrate. Then, a gate electrode is formed so as to cover top and upper-side surfaces of the silicon fin portion. Thus, a three-dimensional channel structure is achieved. In any case, the gate length can be increased, thereby preventing the short channel effect.

Additionally, it has been considered for a DRAM that a recessed gate transistor is used as a selection transistor forming a memory cell. In the case of the recessed gate transistor, a gate electrode (word line) is buried in a surface layer of a semiconductor substrate. In other words, the gate electrode does not protrude from the surface of the semiconductor substrate. Among wires connected to memory cells, only bit liens are positioned over the semiconductor substrate, thereby simplifying arrangement of capacitors, contact plugs, and the like, and enabling easy processing of these elements.

Among the above transistors having the three-dimensional channel structures, there is a transistor including a saddle-fin gate electrode 106, as shown in FIGS. 20 and 21. The saddle-fin gate electrode 106 is formed by: forming recessed gate grooves 103 and 104 in a device isolation region 101 and an active region 102 of a substrate 100, respectively; and forming a conductive material film that fills the grooves 103 and 104 through a gate insulating film 105. Two adjacent active regions 102, between which the gate electrode 106 is formed, include a source region 107a and a drain region 107b (impurity diffusion layers) formed by ion implantation.

However, the width of the groove 103 in the device formation region is reduced along with the reduction in the size of memory cells, thereby increasing the aspect ratio of the groove 103. For this reason, both side surfaces 103a and 103b of the groove 103 have the downwardly narrowing taper shape.

The gate electrode 106 fills the gate grooves 103 and 104 so as to cover the top and upper side surfaces of active regions 102. In this case, the portion of the gate electrode 106, which is in contact with the bottom surface 103c and the tapered side surfaces 103a and 103b of the groove 103, is isolated from the side surface of the active region 102.

Therefore, the side surface of the active region 102 does not function as a channel, and only the upper surface of the active region 102 can function as an effective channel, thereby making it difficult to achieve a sufficient amount of on-current.

FIGS. 22 and 23 illustrate a process flow indicative of a method of manufacturing the above transistor. FIGS. 22A and 23A are plan views. FIGS. 22B and 23B are cross-sectional views taken along line X1-X1' shown in FIGS. 22A and 23A. FIGS. 22C and 23C are cross-sectional views taken along line X2-X2' shown in FIGS. 22A and 23A. FIGS. 22D and 23D are cross-sectional views taken along line Y1-Y1' shown in FIGS. 22A and 23A. FIGS. 22E and 23E are cross-sectional views taken along line Y2-Y2' shown in FIGS. 22A and 23A. FIGS. 22F and 23F are cross-sectional views taken along line Y3-Y3' shown in FIGS. 22A and 23A.

Firstly, multiple device isolation grooves 108 are formed in a cell array region SA' of the substrate 100 including a silicon surface layer. Then, a silicon oxide film 109 is formed so as to fill the grooves 108, as shown in FIG. 22A to 22D. Then, upper surfaces of the substrate 100 and the silicon oxide film 109 are planarized. Thus, the aforementioned device isolation regions 101 and the active regions 102 defined by the device isolation region 101 are formed. The device isolation region 101 and the active region 102 are alternately arranged. At the same time, a groove 108A, which is wider than the device isolation groove 108, is formed in a peripheral region CA' outside the cell array region SA'. The groove 108A and the device isolation groove 108 have the same depth. The grooves 108 and 108A are filled with the silicon oxide film 109.

Then, a mask layer 110a and a mask layer 110b over the mask layer 110a are formed over the substrate 100. Then, a resist layer (not shown), which has openings at positions corresponding to those of the gate electrodes 106, is formed over the mask layer 110b. Then, the mask layers 110a and 110b are patterned with the resist layer as a mask. Then, the silicon oxide films 109, which fill the grooves 108 and 108A, are selectively removed with the mask layers 110a and 110b. Thus, the recessed gate grooves 103 are formed in the device formation region 101, as shown in FIGS. 23D and 23E.

At this time, both side surfaces 103a and 103b of the groove 103, which are formed in the silicon oxide film 109 in the device formation region 101, have the tapered shape, as shown in FIG. 23C. Additionally, a variation in depth of each groove 103 in the cell array region SA' is likely to become large. For this reason, the thickness (vertical size) of the silicon oxide film 109 remaining in a bottom portion of each device isolation groove 108 in the cell array region SA' varies, thereby causing a variation in characteristics of transistors arranged in the cell array region SA', and therefore causing malfunction of memory cells.

On the other hand, to make the side surfaces 103a and 104b of the groove 103 vertical, the silicon oxide film 109 can be over-etched after the groove 103 is formed. However, it is easier to etch the silicon oxide film 109 in the groove 108A in the peripheral region CA' than the silicon oxide film 109 in the groove 108 in the cell array region SA'. For this reason, if the silicon oxide film 109 in the cell array region SA' is further etched, the silicon oxide film 109 in the groove 108A is fully removed, thereby causing the bottom surface of the groove 108A to be exposed. Therefore, the over-etching of the silicon oxide film 109 to make the side surfaces 103a and 103b vertical cannot be carried out.

Although multiple device isolation regions 101 and the active regions 102 are arranged in the cell array region SA' of an actual transistor, only several device isolation regions 101 and active regions 102 are shown in FIGS. 21A to 23F for simplification.

SUMMARY

In one embodiment, a method of manufacturing a semiconductor device may include, but is not limited to the following processes. A semiconductor substrate is prepared. The semiconductor substrate has a first region and a second region other than the first region. A first mask is formed over the first region. The first mask has a first line-and-space pattern extending in a first direction. A first removing process is performed. The first removing process selectively removes the first region with the first mask to form a first groove extending in the first direction. The first removing process removes an upper part of the second region while a remaining part of the second region having a first surface facing upward. The bottom level of the first groove is higher than the level of the first surface.

In another embodiment, a method of manufacturing a semiconductor device may include, but is not limited to the following processes. First and second grooves are formed in a semiconductor substrate. The first and second grooves extend in a first direction. A first insulating film, which fills bottom portions of the first and second grooves, is formed. A second insulating film is formed over the first insulating film. The second insulating film includes first and second portions filling up the first and second grooves, respectively. The second insulating film is selectively removed down to the top level of the first insulating film to form first and second trenches in the first and second portions, respectively, while the first insulating film covers the bottom portions of the first and second grooves.

In another embodiment, a method of manufacturing a semiconductor device may include, but is not limited to the following processes. A semiconductor substrate is prepared. The semiconductor substrate has a first region (SA) and a second region (CA) other than the first region. The first region extends upwardly. The first region has a first groove extending in a first direction. The bottom level of the first groove is higher than the top level of the second region. A first insulating film (28), which fills a bottom portion of the first groove, is formed. A second insulating film, which covers the first insulating film and the second region, is formed. The top level of the second insulating film is equal to the top level of the semiconductor substrate. A first removing process is performed. The first removing process selectively removes the second insulating film down to the top level of the first insulating film to form a first trench in the first region. The first trench has a side surface narrowing downwardly in view of a second direction different from the first direction. A second removing process is performed. The second removing process selectively removes the second insulating film to make the side surface of the first trench vertical while a remaining part of the second insulating film covers the second region.

BRIEF DESCRIPTION OF THE DRAWINGS

The above features and advantages of the present invention will be more apparent from the following description of certain preferred embodiments taken in conjunction with the accompanying drawings, in which:

FIGS. 3A to 19A are plan views illustrating a process flow indicative of a method of manufacturing the semiconductor device shown in FIG. 1;

FIGS. 3B to 19B are cross-sectional views taken along line X1-X1' shown in FIGS. 3A to 19A;

FIGS. 3C to 19C are cross-sectional views taken along line X2-X2' shown in FIGS. 3A to 19A;

FIGS. 3D to 19D are cross-sectional views taken along line Y1-Y1' shown in FIGS. 3A to 19A;

FIGS. 3E to 19E are cross-sectional views taken along line Y2-Y2' shown in FIGS. 3A to 19A;

FIGS. 10F to 19F are cross-sectional views taken along line Y3-Y3' shown in FIGS. 10A to 19A;

FIGS. 22A and 23A are plan views illustrating a process flow indicative of a method of manufacturing the semiconductor device shown in FIG. 20;

FIGS. 22B and 23B are cross-sectional views taken along line X1-X1' shown in FIGS. 22A and 23A;

FIGS. 22C and 23C are cross-sectional views taken along line X2-X2' shown in FIGS. 22A and 23A;

FIGS. 22D and 23D are cross-sectional views taken along line Y1-Y1' shown in FIGS. 22A and 23A;

FIGS. 22E and 23E are cross-sectional views taken along line Y2-Y2' shown in FIGS. 22A and 23A; and FIG. 23F is a cross-sectional view taken along line Y3-Y3' shown in FIG. 23A.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
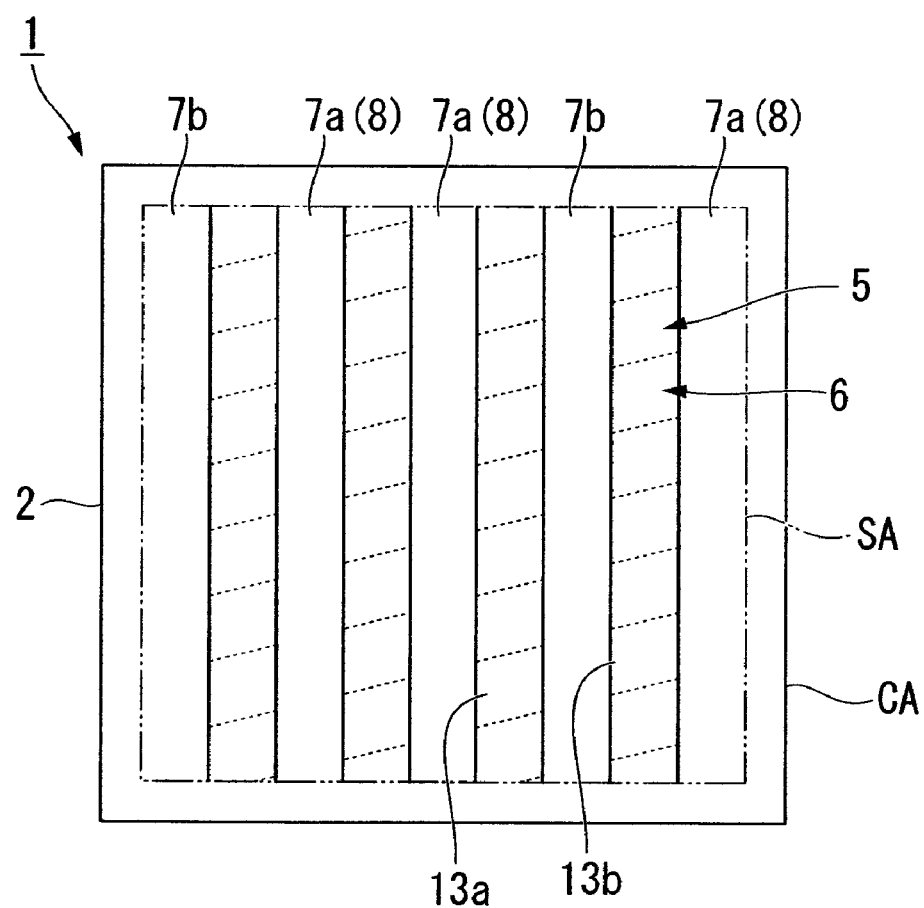
FIG. 1 is a plan view illustrating a semiconductor device according to a first embodiment of the present invention.
Figure 2:
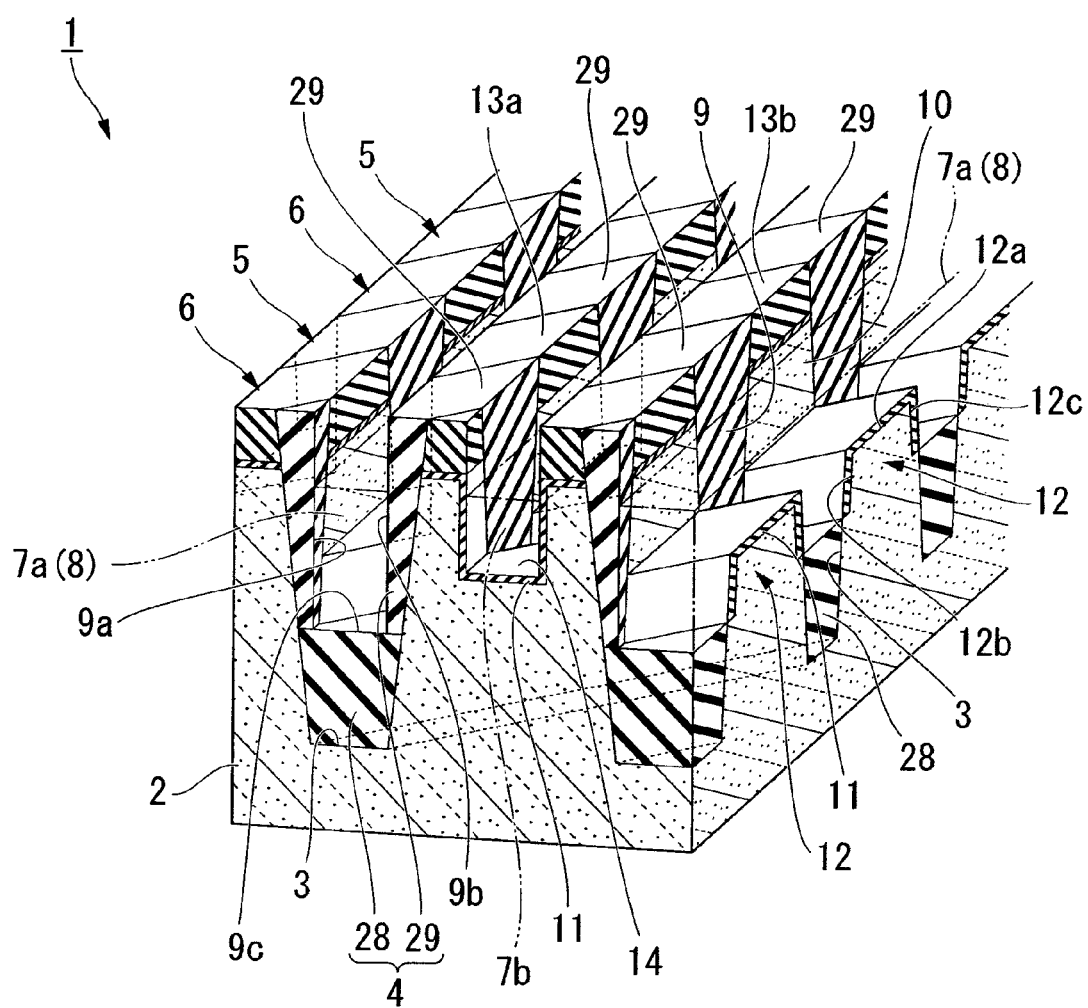
FIG. 2 is a bird's eye view illustrating a main part of the semiconductor device shown in FIG. 1.
Figure 4C:
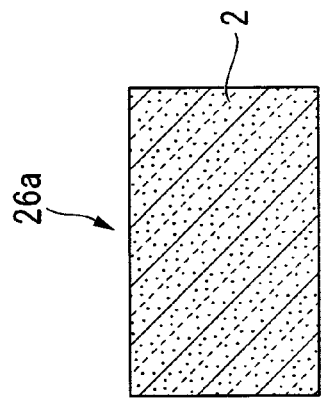
Figure 4B:
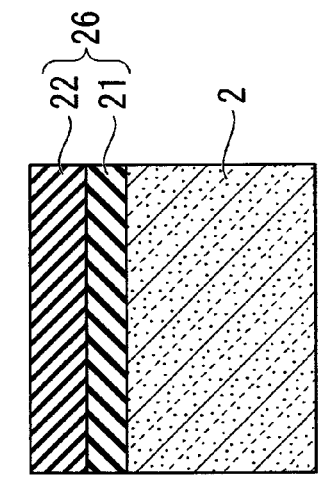
Figure 4E:
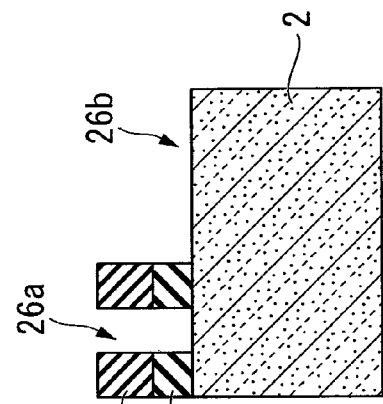
Figure 4A:
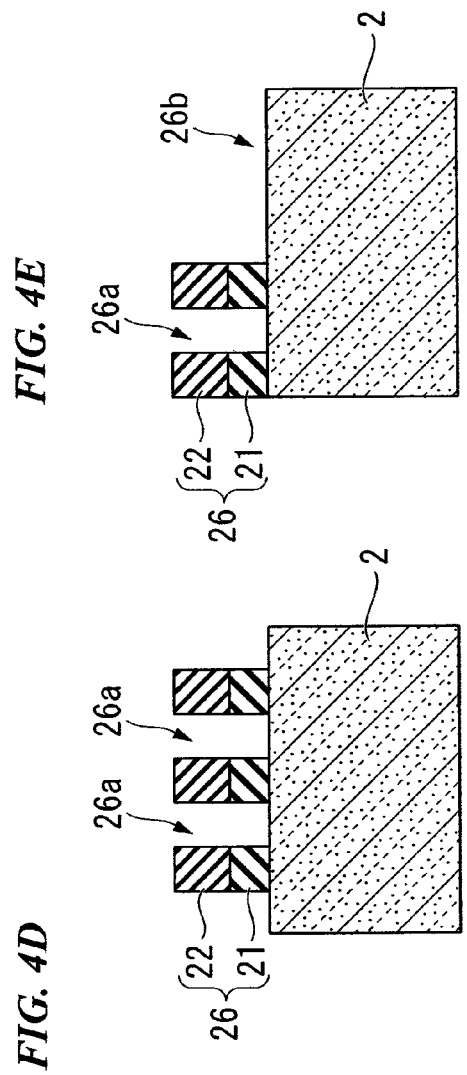
Figure 4D:
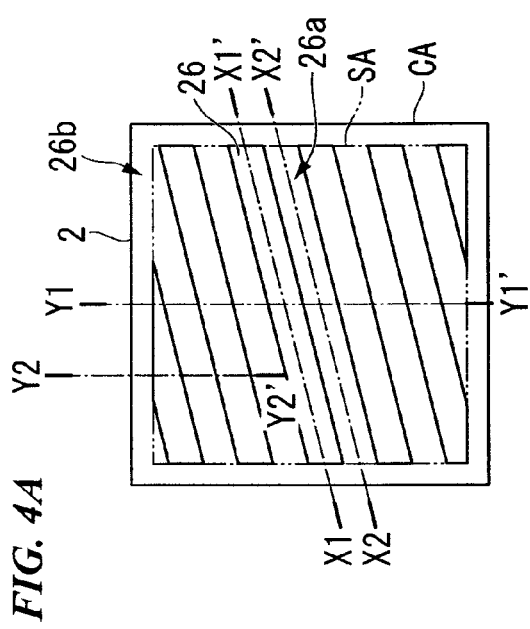
Figure 6C:
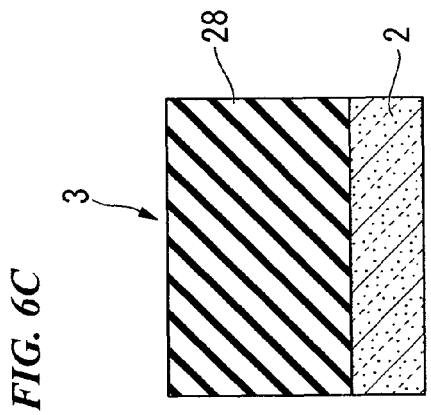
Figure 6B:
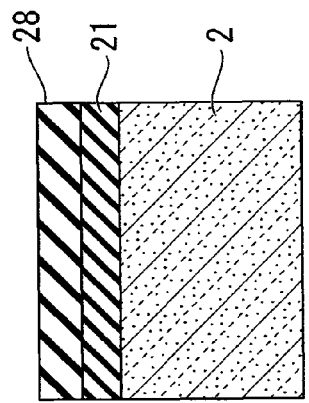
Figure 6E:
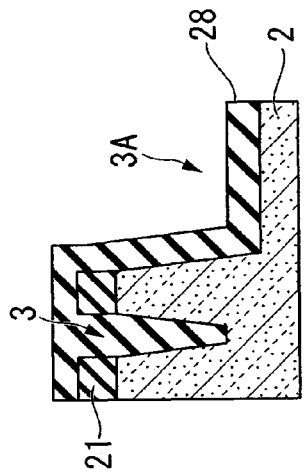
Figure 6A:
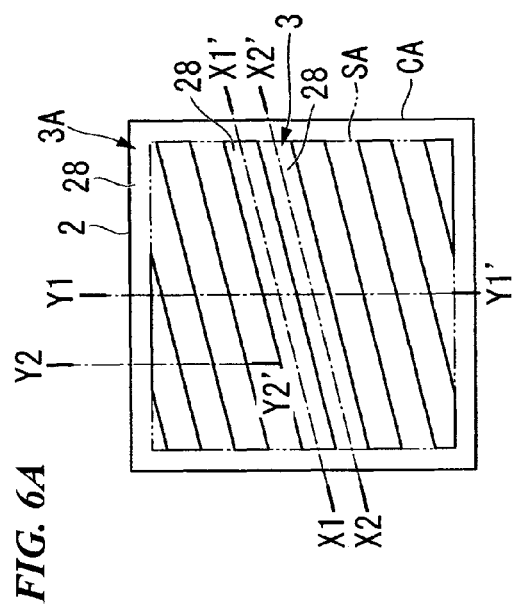
Figure 6D:
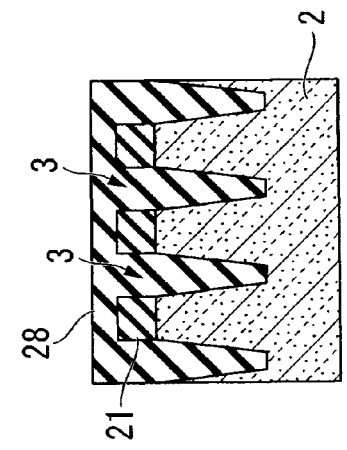
Figure 7C:
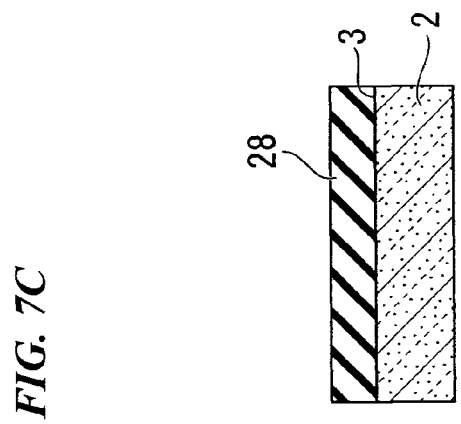
Figure 7B:
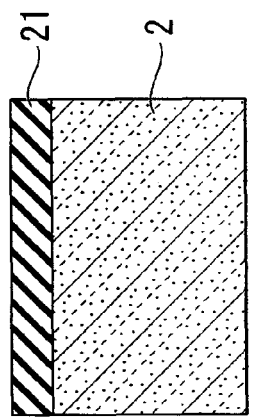
Figure 7E:
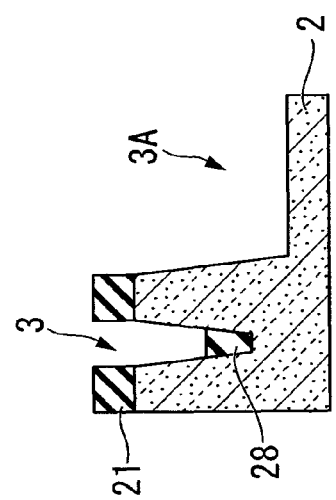
Figure 7A:
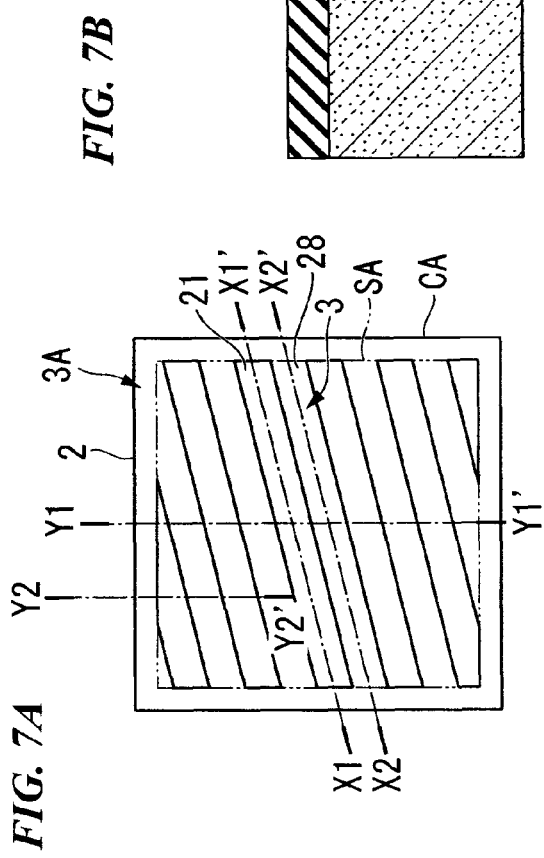
Figure 7D:
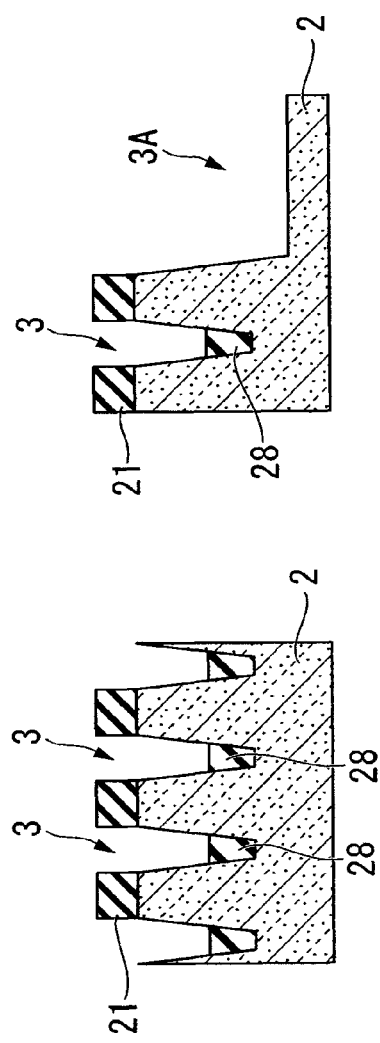
Figure 8C:
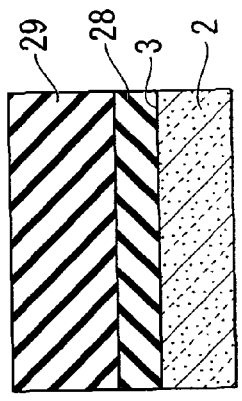
Figure 8B:
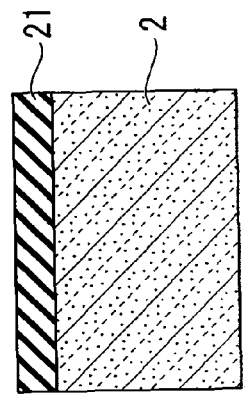
Figure 8E:
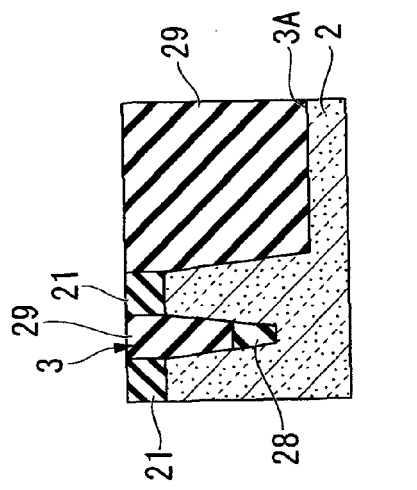
Figure 8A:
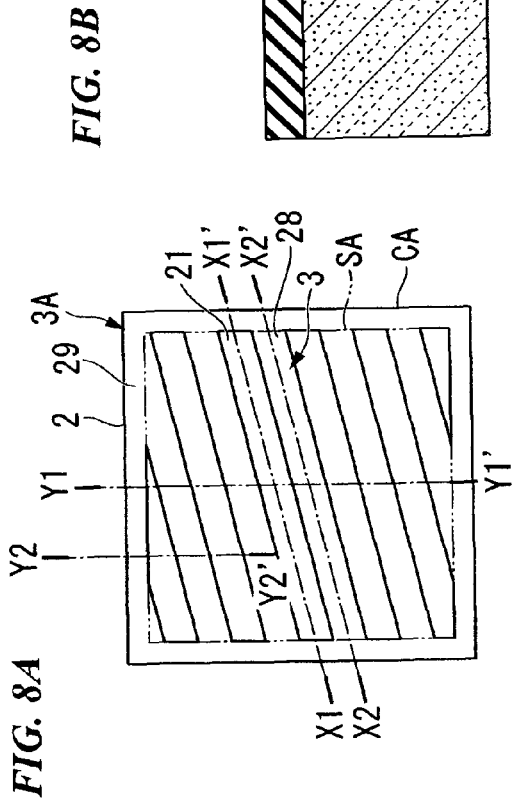
Figure 8D:
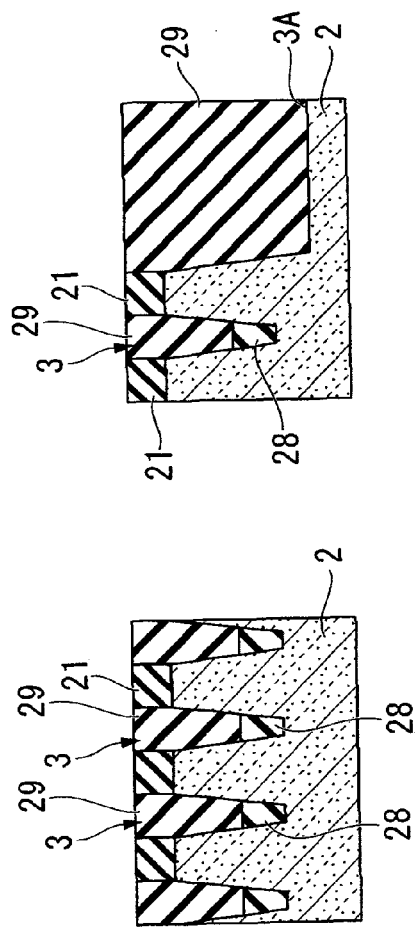
Figure 11C:
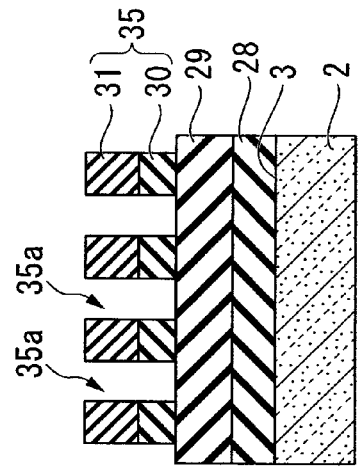
Figure 11F:
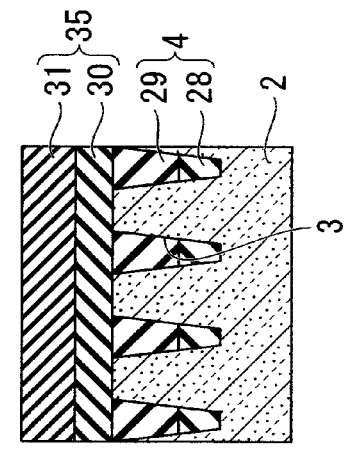
Figure 11B:
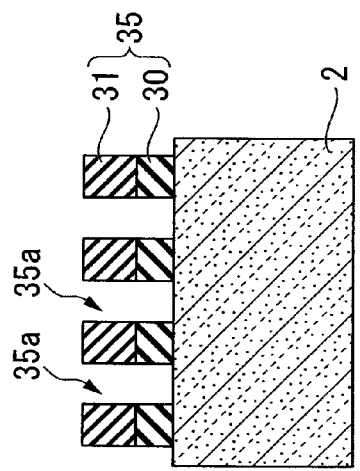
Figure 11E:
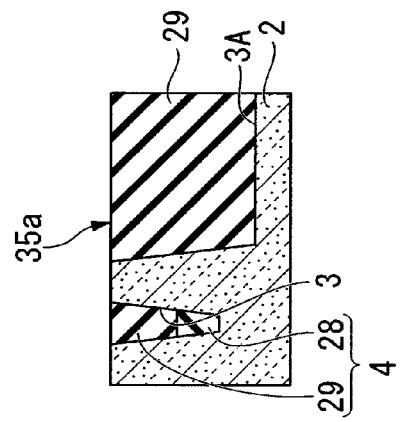
Figure 11A:
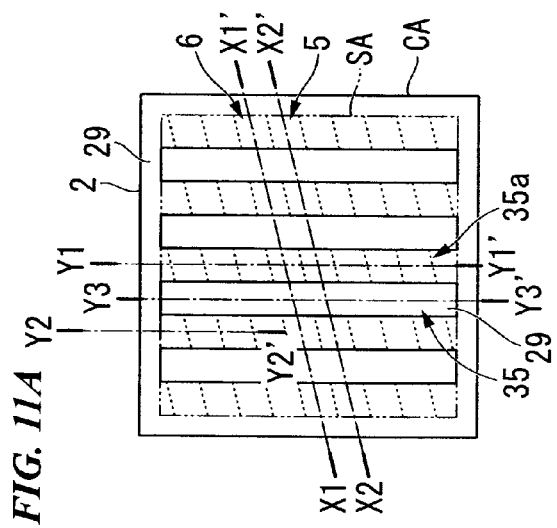
Figure 11D:
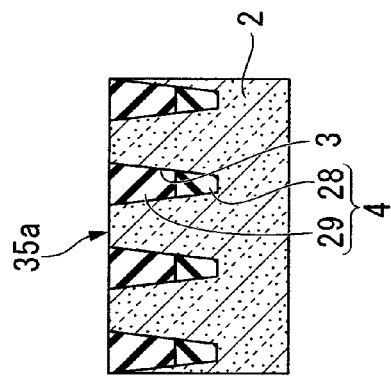
Figure 14C:
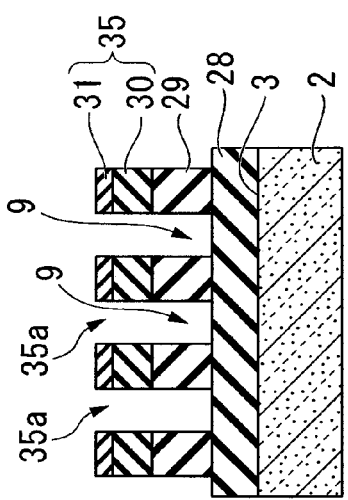
Figure 14F:
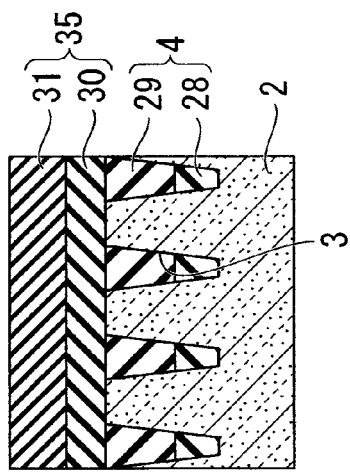
Figure 14B:
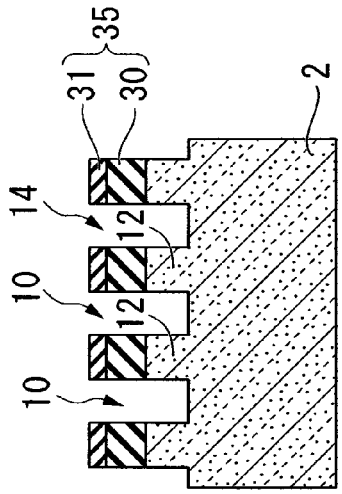
Figure 14E:
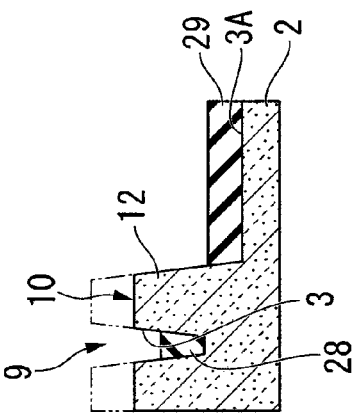
Figure 14A:
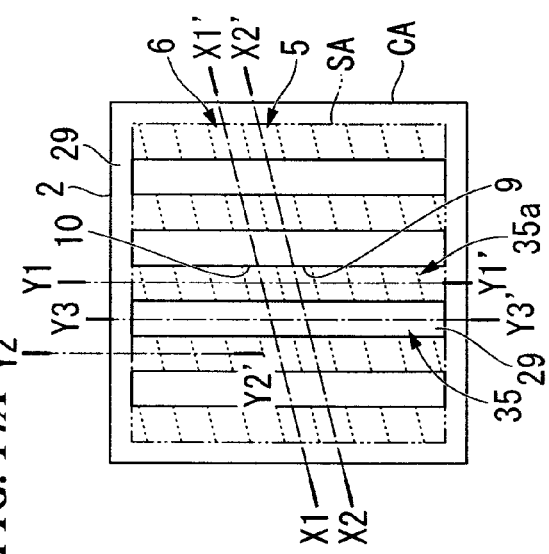
Figure 14D:
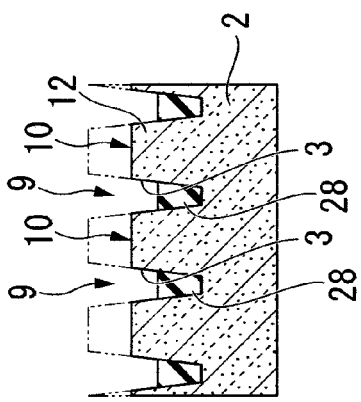
Figure 15C:
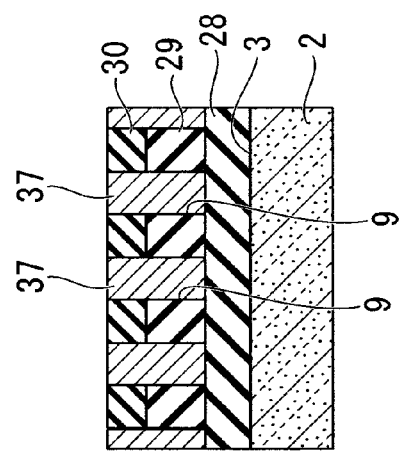
Figure 15B:
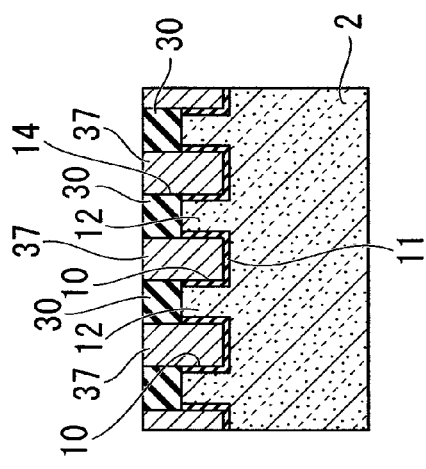
Figure 15F:
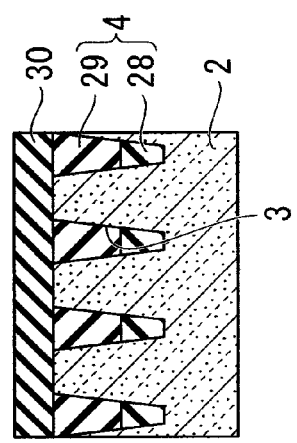
Figure 15E:
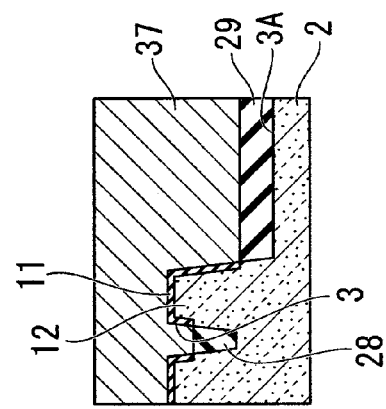
Figure 15A:
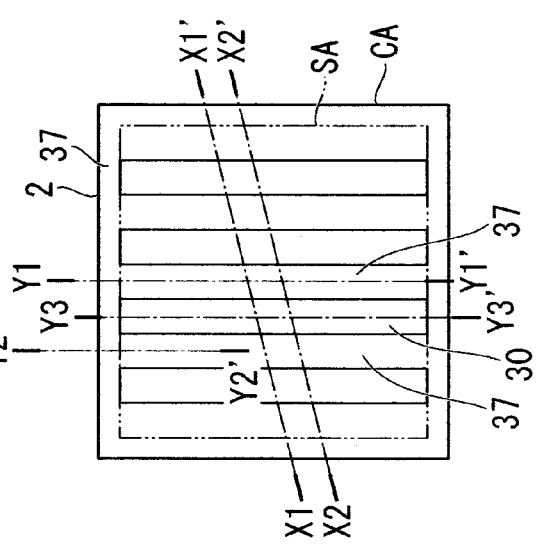
Figure 15D:
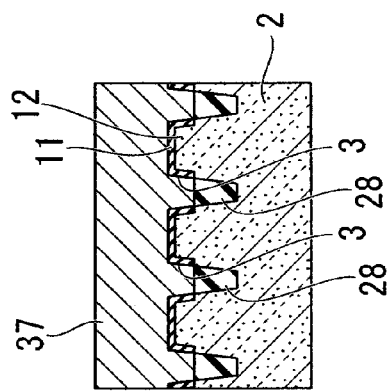
Figure 18C:
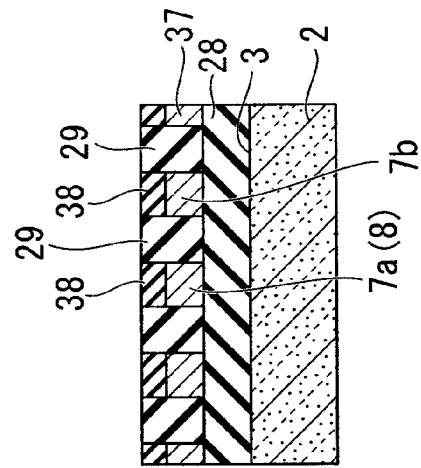
Figure 18B:
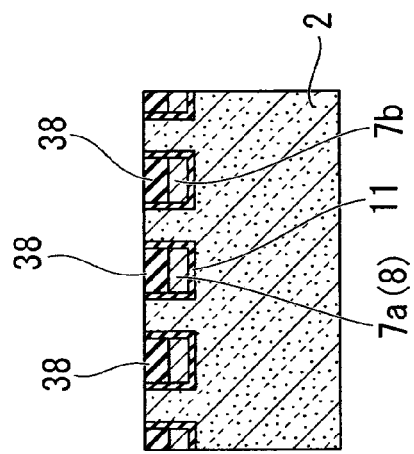
Figure 18A:
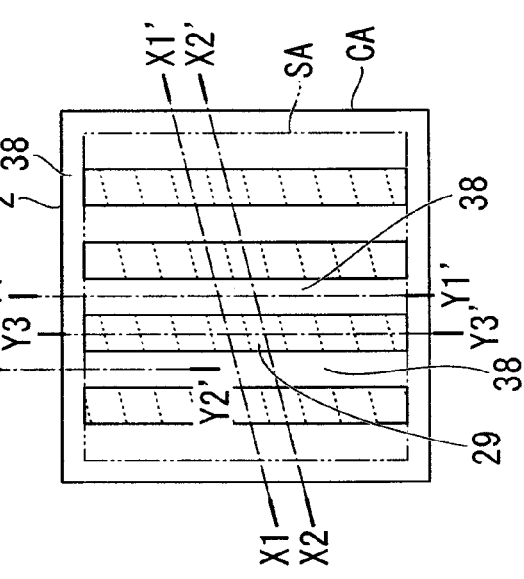
Figure 18F:
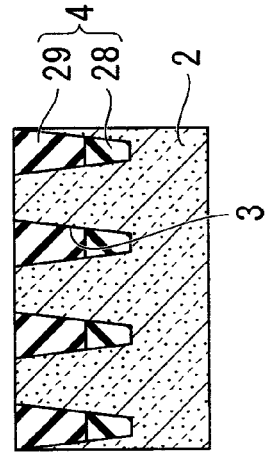
Figure 18E:
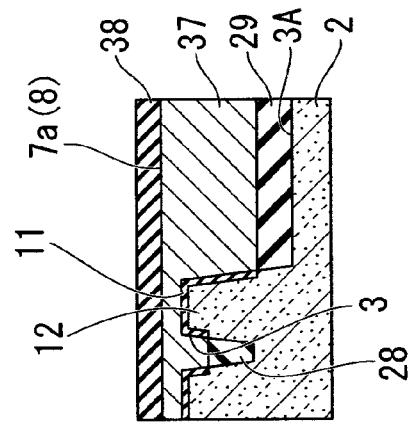
Figure 18D:
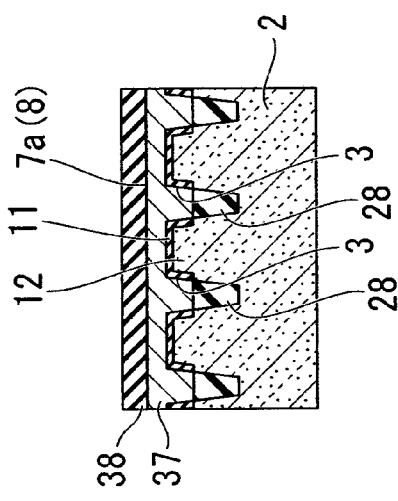
Figure 20:
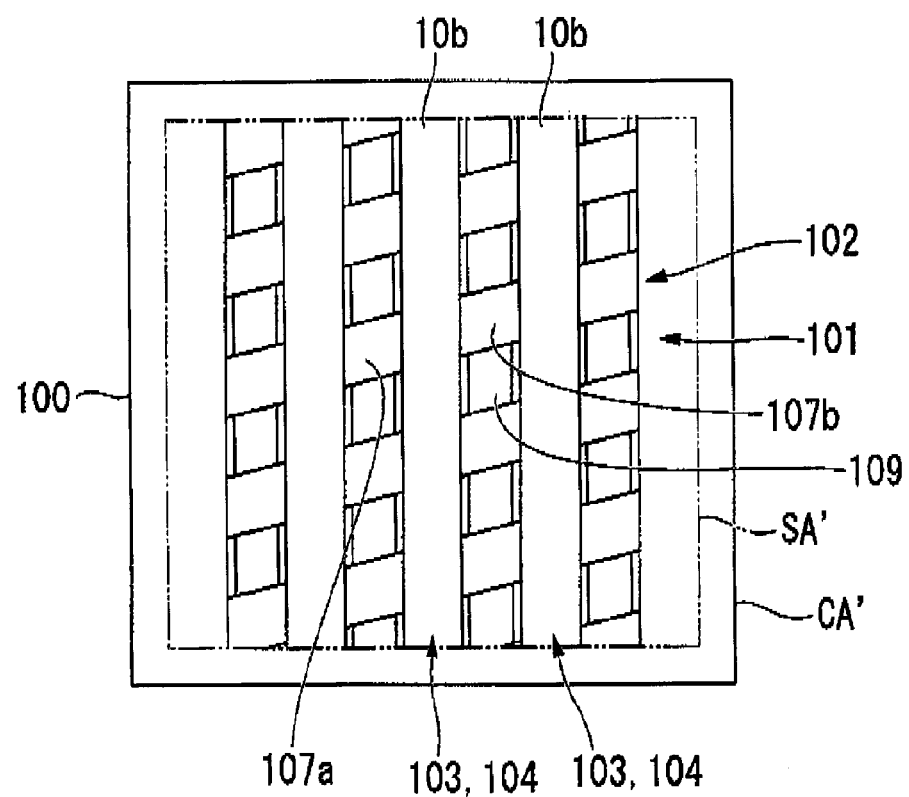
FIG. 20 is a plan view illustrating a semiconductor device of a related art.
Figure 21:
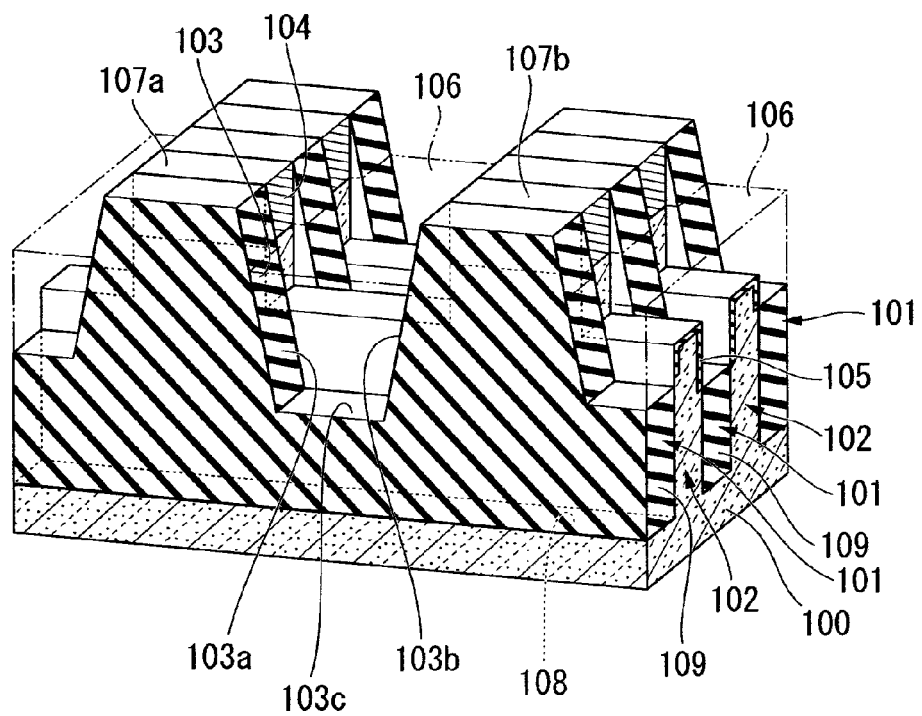
FIG. 21 is a bird's eye view illustrating a main part of the semiconductor device shown in FIG. 20.
Figure 22B:
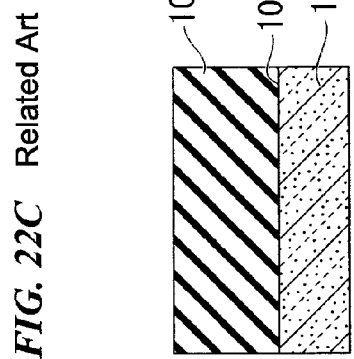
Figure 22C:
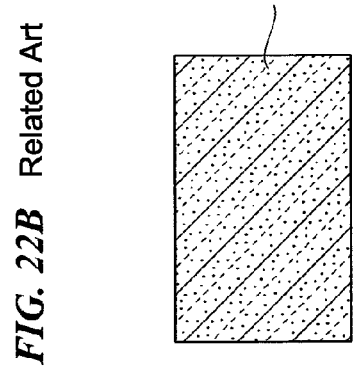
Figure 22A:
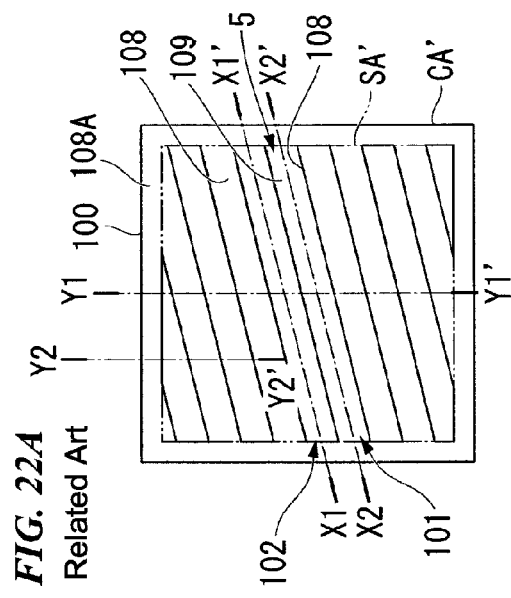
Figure 22E:
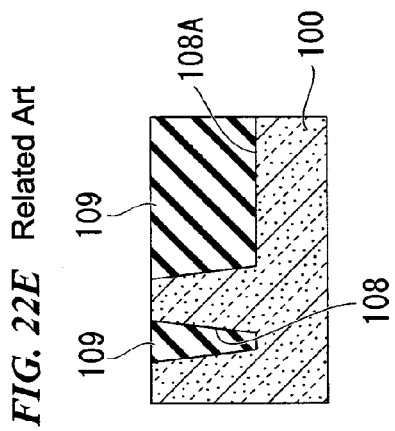
Figure 22D:
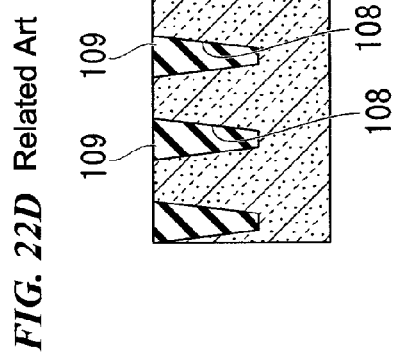

Hereinafter, a semiconductor device 1 according to a first embodiment of the present invention is explained. FIG. 1 is a plan view illustrating the semiconductor device 1. FIG. 2 is a bird's eye view illustrating a main part of the semiconductor device 1.

The semiconductor device 1 functions as a DRAM. The semiconductor device 1 includes a semiconductor substrate 2 having a cell array region SA and a peripheral region CA outside the cell array region SA, as shown in FIG. 1. In the cell array region SA, multiple memory cells are arranged in a matrix. In the peripheral region CA, a contact pad is formed, which connects a gate electrode (word line) included in each memory cell to an upper wiring layer. A memory cell in the cell array region SA includes a selection transistor, and a capacitor electrically connected to any one of a source and a drain of the selection transistor.

The semiconductor substrate 2 has multiple device isolation grooves 3 in the cell array region SA. The device isolation grooves 3 extend in a first direction. A device isolation insulating film 4, which includes a silicon nitride film 28 and a silicon oxide film 29, is formed so as to fill the grooves 3.

Thus, multiple device isolation regions 5 and multiple active regions 6 defined by the device isolation regions 5 are arranged alternately. The device isolation region 5 is called an STI (Shallow Trench Isolation) region.

Multiple word lines 7a and multiple dummy word lines 7b are arranged in the cell array region SA. The word lines 7a and dummy word lines 7b extend in a second direction crossing the first direction. In the first embodiment, the dummy word line 7b is arranged between two pairs of word lines 7a.

The word line 7a forms a gate electrode 8 of the selection transistor. The gate electrode 8 is formed by filling the recessed gate grooves 9 and 10 in the device isolation region 5 and the active region 6 with a conductive material film through a gate insulating film 11. In other words, the gate electrode 8 is a recessed gate electrode.

Specifically, the grooves 9 are formed in the device isolation regions 5 between which the active region 6 is positioned. A groove 10, which is shallower than the groove 9, is formed in the active region 6. Thus, a fin portion 12, which extends upwardly, is formed in the active region 6 between the grooves 9. A top surface 12a of the fin portion 12 is higher in level than a bottom surface of the groove 9 and is lower in level than a top surface of the active region 6 (i.e., a top surface of the semiconductor substrate 2). The gate electrode 8 covers the top and side surfaces of the fin portion 12 so as to straddle the fin portion 12. Part of the gate electrode 8 is buried in the recessed gate grooves 9 and 10, thereby forming a saddle-fin channel structure. The channel structure of the semiconductor device 1 can achieve a longer gate length, and thereby prevent the short channel effect.

The active regions 6, between which the gate electrode 8 is positioned, includes a drain region 13a and a source region 13b (impurity diffusion layers) of the selection transistor. The drain and source regions 13a and 14b are formed by ion-implantation.

The dummy word line 7b is kept at a predetermined voltage and isolates adjacent transistors in the same active region. Additionally, the dummy word line 7b is kept at a predetermined voltage, turns a parasitic transistor to an off-state, and thereby isolates the parasitic transistor. The dummy word line 7b is formed by: forming a groove 14 having the same structure as that of the word line 7a; and filling the groove 14 with a conductive material film.

Both side surfaces 9a and 9b of the recessed gate groove 9 in the device isolation region 5 are vertical to the bottom surface 9c. In this case, the gate electrode 8 buried in the groove 9, and a top surface 12a and side surfaces 12b and 12c of the fin portion 12 can function as effective channels. The fin portion 12 faces the groove 9 through a gate insulating film 11. Accordingly, the short channel effect can be prevented, thereby achieving a sufficient amount of on-current.

The silicon nitride film 28 having a predetermined vertical thickness fills each device isolation groove 3 in the cell array region SA. A top surface of the silicon nitride film 28 is positioned at the bottom surface 9a of the recessed gate groove 9 in the device isolation region 5. In this case, among the recessed gate grooves 9 and 10 in the cell array region SA, a variation in the vertical length of each recessed gate groove 9 can be prevented. Accordingly, the shape of the gate electrode 8 buried in each groove 9 can be kept uniform, thereby preventing a variation in characteristics of selection transistors in the cell array region SA, and therefore preventing malfunction of memory cells.

Although multiple device isolation regions 5 and active regions 6 are formed in the cell array region SA in an actual case, several device isolation regions 5 and active regions 6 in the cell array region SA are shown in FIG. 1 for simplification. The same can apply to FIGS. 3 to 19.

Hereinafter, a method of manufacturing the semiconductor device 1 is explained with reference to FIGS. 3A to 19F. FIGS. 3A to 19A are plane views. FIGS. 3B to 19B are cross-sectional views taken along line X1-X1' shown in FIGS. 3A to 19A. FIGS. 3C to 19C are cross-sectional views taken along line X2-X2' shown in FIGS. 3A to 19A. FIGS. 3D to 19D are cross-sectional views taken along line Y1-Y1' shown in FIGS. 3A to 19A. FIGS. 3E to 19E are cross-sectional views taken along line Y2-Y2' shown in FIGS. 3A and 19A. FIGS. 10F to 19F are cross-sectional views taken along line Y3-Y3' shown in FIGS. 10A to 19A.

Firstly, the semiconductor substrate 2 is prepared as shown in FIGS. 3A to 3E. The semiconductor substrate 2 is a substrate containing an impurity at a predetermined concentration, such as a silicon substrate.

Then, a mask layer 26 is formed over the semiconductor substrate 2. The mask layer 6 includes: a silicon nitride (SiN) film 21 over the semiconductor substrate 2; an amorphous carbon (α-C) film 22 over the silicon nitride film 21; a silicon oxynitride (SiON) film 23 over the amorphous carbon film 22; a silicon oxide (SiO) film 24 over the silicon oxynitride film 23; and an anti-reflective (BARC) film 25 over the silicon oxide film 24.

Then, a photoresist (PR) film is formed over the mask layer 26. Then, a resist pattern 27 having a shape corresponding to the shape of the active region 6 is formed while the photoresist film is patterned by a lithography process. Thus, openings 27a are formed in the device isolation region 5. Additionally, an opening 27b is formed in the peripheral region CA.

Then, the mask layer 26 is patterned by an anisotropic dry etching process with the resist pattern 27 as a mask, as shown in FIGS. 4A to 4E. At this time, the resist pattern 27 is removed by the dry etching process. However, the shape of the resist pattern 27 is transferred onto the mask layer 26. Thus, the mask layer 26 is patterned correspondingly to the shape of the resist pattern 27. Then, the mask layer 26 is also removed while the shape of the resist pattern 27 is transferred from an upper layer to a lower layer. For this reason, when the patterning of the mask layer 26 ends, the anti-reflective film 25, the silicon oxide film 24, and the silicon oxynitride film 23 are fully removed. Thus, a remaining portion of the mask layer 26 includes the amorphous carbon film 22 and the silicon nitride film 21, which are patterned such that holes 26a are formed in the device isolation region 5, and that holes 26b are formed in the peripheral region CA.

Then, the semiconductor substrate 2 is patterned by an anisotropic dry etching process with the patterned mask layer 26, as shown in FIGS. 5A to 5E. The anisotropic dry etching process can be sequentially carried out after the process shown in FIGS. 4A to 4E. Thus, the shape of the mask layer 26 is transferred onto the surface of the semiconductor substrate 2, and multiple device isolation grooves 3 extending in the first direction are formed in the cell array region SA.

When the device isolation grooves 3 are formed, a groove 3A, which is deeper than the groove 3 in the cell array region SA, is formed in the peripheral region CA outside the cell array region SA using the micro-loading effect. Specifically, the groove 3A in the peripheral region CA has a larger horizontal width than that of the groove 3 in the cell array region SA. The depth of the groove 3A is such that the silicon oxide film 29 filling the groove 3A remains after an over-etching process as will be explained later.

Then, exposed surfaces of the grooves 3 and 3A are thermally-oxidized by ISSG (In Situ Stream Generation) to form a silicon oxide film (not shown). Then, a silicon nitride film 28 is formed over the silicon oxide film by a LP-CVD (Low Pressure-Chemical Vapor Deposition) method, as shown in FIGS. 6A to 6E. The silicon nitride film 28 has enough vertical thickness to fill the groove 3 in the cell array region SA. However, the silicon nitride film 28 need not fully fill the groove 3A in the peripheral region CA.

Then, the silicon nitride film 28 is selectively removed by a wet-etching process with a heated phosphoric acid ($H_3PO_4$), as shown in FIGS. 7A to 7E. At this time, the silicon nitride film 28 with a predetermined vertical thickness remains in a bottom portion of the groove 3 in the cell array region SA. However, the silicon nitride film 28 in the groove 3A in the peripheral region CA is fully removed.

Then, the silicon oxide film 29 is formed by an HDP-CVD (High Density Plasma-Chemical Vapor Deposition) method over the entire surface of the semiconductor substrate 2, as shown in FIGS. 8A to 8E. Then, a surface of the silicon oxide film 29 is polished by a CMP (Chemical Mechanical Polishing) method until an upper surface of the silicon nitride film 21 is exposed. In this case, the silicon nitride film 21 serves as a stopper.

Then, the silicon oxide film 29 is selectively removed by a wet-etching process with hydrofluoric acid so that the top level of the silicon oxide film 29 equals the top level of the semiconductor substrate 2, as shown in FIGS. 9A to 9E. Then, the silicon nitride film 21 is removed by a wet-etching process with heated phosphorous acid ($H_3PO_4$). Thus, the device isolation regions 5 and the active regions 6 defined by the device isolation regions 5 are formed. The device isolation region 5 and the active region 6 are alternately arranged and extend in the first direction. The device isolation insulating film 4, which includes the silicon nitride film 28 and the silicon oxide film 29, is formed in the device isolation groove 3.

Then, a mask layer 35 is formed over the entire surface of the semiconductor substrate 2, as shown in FIGS. 10A to 10F. The mask layer 35 includes: a silicon nitride (SiN) film 30 over the semiconductor substrate 2; an amorphous carbon ($\alpha$-C) film 31 over the silicon nitride film 30; a silicon oxynitride (SiN) film 32 over the amorphous carbon film 31; a silicon oxide (SiO) film 33 over the silicon oxynitride film 32; and an anti-reflective (BARC) film 34 over the silicon oxide film 33. Then, a photoresist (PR) film is formed over the mask layer 35. Then, a resist pattern 36 is formed while the photoresist film is patterned by a lithography process. The resist pattern 36 has openings 36a at positions corresponding to the positions of grooves 9 each crossing the device isolation region 5 and to the positions of grooves 10 each crossing the device isolation region 6.

Then, the mask layer 35 is patterned by an anisotropic dry etching process with the resist pattern 36 as a mask, as shown in FIGS. 11A to 11F. At this time, the resist pattern 36 is removed by the dry etching process. However, the shape of the resist pattern 36 is transferred onto the mask layer 35. Thus, the mask layer 35 can be patterned according to the shape of the resist pattern 36. The mask layer 35 is also removed while the shape of the resist pattern 36 is transferred from an upper layer to a lower layer. For this reason, when the patterning of the mask layer 35 ends, all the anti-reflective film 34, the silicon oxide film 33, and the silicon oxynitride film 32 are removed. The mask layer 35, which includes the patterned amorphous carbon film 31 and the patterned silicon nitride film 30, remains. The mask layer 35 has holes 35a at positions corresponding to those of the recessed gate grooves 9 and 10.

Then, only the silicon oxide film 29, which is exposed to the holes 35a, is selectively removed by an anisotropic selective etching process with the patterned mask 35 as a mask, as shown in FIGS. 12A to 12F. Thus, the recessed gate grooves 9 and the dummy gate grooves 14 are formed in the device isolation region 5.

In the first embodiment, a two-step etching process is used to form the grooves 9. In the first-step of the etching process, the etching process is carried out until an upper surface of the silicon nitride film 28 previously filling the device isolation region 3 is partially exposed. In this step, similar to the case of the related art, the both side surfaces 9a and 9b of the groove 9 with the large aspect ratio have a downwardly narrowing taper shape.

Then, in the second step of the anisotropic etching process, the silicon oxide film 29 is over-etched until the side surfaces 9a and 9b of the recessed gate groove 9 become vertical to the bottom surface 9c of the groove 9, as shown in FIGS. 13A to 13F. At this time, the silicon nitride film 28 buried in the device isolation groove 3 functions as an etching stopper, thereby preventing a variation in vertical size of each recessed gate groove 9 in the cell array region SA. Since the groove 3A in the peripheral region CA is deeper than the groove 3 in the cell array region SA, the silicon oxide film 29 in the groove 3A is thicker than that in the groove 3 in the cell array region SA. Accordingly, the silicon oxide film 29 in the groove 3A can remain after the over-etching process.

Then, only a surface layer (silicon layer) of the semiconductor substrate 2 exposed to the holes 35a is selectively removed by an anisotropic selective etching process with the patterned mask layer 35. Thus, the recessed gate grooves 10 and the dummy gate grooves 14 are formed as shown in FIGS. 14A to 14F. The grooves 10 and 14 are shallower than the grooves 9. Thus, the fin portion 12, which upwardly protrudes between grooves 9, is formed. Accordingly, the top level of the fin portion 12 is higher than the bottom level of the groove 9 in the device isolation region 5, and is lower than the level of an upper surface of the active region 6 (i.e., the level of the upper surface of the semiconductor substrate 2).

Then, the amorphous carbon film 31 is removed. Then, the surfaces of the grooves 9, 10, and 14, which are exposed to the holes 35a of the mask layer 35, are thermally-oxidized by ISSG (In Situ Stream Generation). Thus, the gate insulating film 11, which is made of a silicon oxide film, is formed as shown in FIGS. 15A to 15F.

Then, a conductive film 37, which includes a titanium nitride (TiN) film and a tungsten (W) film, is formed over the entire surface of the semiconductor substrate 2. Then, an upper surface of the conductive film 37 is polished by a CMP process until the upper surface of the silicon nitride film 30 is exposed. In this case, the silicon nitride film 30 functions as a stopper.

Then, the conductive film 37, which fills the grooves 9, 10, and 14, is etched. Thus, the conductive film 37 with a predetermined thickness remains in bottom portions of the grooves 9, 10, and 14. The predetermined thickness of the conductive film 37 is such that the conductive film 37 covers at least the upper surfaces of the fin portions 12, and that the top level of the conductive film 37 is smaller than the level of the upper surface of the active region 6 (i.e., the upper surface of the semiconductor substrate 2) at most. Thus, the gate electrode 8 (i.e., word line 7a) and the dummy word line 7b are formed.

Then, a silicon oxide film 38 is formed by an HDP-CVD method over the entire surface of the semiconductor substrate 2, as shown in FIGS. 17A to 17F. Then, an upper surface of the silicon oxide film 38 is polished by a CMP process until the upper surface of the silicon nitride film 30 is exposed. In this case, the silicon nitride film 30 functions as a stopper.

Then, the silicon oxide film 38 is selectively removed by a wet etching process with hydrofluoric acid (HF) so that the top level of the silicon oxide film 38 equals the top level of the semiconductor substrate 2, as shown in FIGS. 18A to 18F. Then, the silicon nitride film 30 is removed by a wet etching process with heated phosphorus acid ($H_3PO_4$).

Then, an n-type impurity, such as phosphorus, is ion-implanted at a low concentration into the surface region of the semiconductor substrate 2 in the active region 6. Thus, the drain region 13a and the source region 13b (impurity diffusion layers) are formed in the active region 6 between the gate electrodes 8. Thus, the semiconductor device 1 as shown in FIGS. 1 and 2 is formed.

According to the method of manufacturing the semiconductor device 1, the silicon nitride film 28 is formed so as to fill the grooves 3 in the cell array region SA and the groove 3A in the peripheral region CA. Then, the silicon nitride film 28 is selectively removed by a wet etching process so that a remaining portion of the silicon nitride film 28 in the grooves 3 in the cell array region SA has a predetermined thickness. Therefore, a variation in a vertical size of the remaining portion of silicon nitride film 28 in the grooves 3 can be prevented.

Additionally, when the recessed gate grooves 9 are formed after the silicon oxide film 29 is formed so as to fill the grooves 3 in the cell array region SA and the groove 3A in the peripheral region CA, the silicon nitride film 28 filling the bottom portion of the groove 3 functions as an etching stopper. Accordingly, a variation in the vertical size of each groove 9 in the device isolation region among the grooves 9 and 10 in the cell array region SA can be prevented.

Further, the silicon oxide film 29 with a sufficient thickness can be formed so as to fill the groove 3A in the peripheral region CA, which is deeper than the groove 3 in the cell array region SA. Even when the silicon oxide film 29 is over-etched until the side surfaces 9a and 9b of the recessed gate groove 9 in the device isolation region SA become vertical to the bottom surface 9c, the silicon oxide film 29 can remain in the groove 3A in the peripheral region CA. Accordingly, the bottom surface of the groove 3A in the peripheral region CA can be prevented from being exposed, thereby enabling isolation of the gate electrode from the semiconductor substrate 2 in the peripheral region CA.

Although not shown, after the process shown in FIG. 19, a cap insulating film is formed. The cap insulating film protects upper surfaces of the gate electrodes 8 (word lines 7a) and the dummy word lines 7b, and has the top level that is substantially equal to the top level of the semiconductor substrate 2. Thus, a selection transistor including the above memory cells is formed in the cell array region SA.

Then, a bit line electrically connected to one of the source and the drain of the selection transistor, a capacitor electrically connected to the other one of the source and drain of the selection transistor, and a wiring layer over the capacitor, are sequentially formed. Thus, a DRAM including multiple memory cells in the cell array region SA can be formed.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

For example, the present invention is not limited to the semiconductor device 1 having the saddle-fin-shaped channel structure, and is applicable to various semiconductor devices having three-dimensional channel structures, such as a recessed channel structure and a fin-shaped channel structure.

In addition, while not specifically claimed in the claim section, the application reserves the right to include in the claim section at any appropriate time the following semiconductor device.

A semiconductor device may include, but is not limited to: a semiconductor substrate; a first insulating film; a second insulating film; a third insulating film; and a conductive film. The semiconductor substrate has a first region and a second region outside the first region. The semiconductor substrate has first and second grooves in the first and second regions, respectively. The first groove is shallower than the second groove. The first insulating film fills a bottom portion of the first groove. The second insulating film fills a bottom portion of the second groove. The third insulating film covers at least a top surface of the semiconductor substrate, a side surface of an upper portion of the first groove, and a side surface of an upper portion of the second groove. The conductive film covers the first to third insulating films. The conductive film fills up the first and second grooves.

Regarding the above semiconductor device, the first and second grooves extend in a first direction. The conductive film has a vertical side surface in a cross-sectional view taken along a line that is parallel to the first direction.

What is claimed is:

1. A method of manufacturing a semiconductor device, comprising:

preparing a semiconductor substrate having a first region and a second region other than the first region;

forming a first mask over the first region, the first mask having a first line-and-space pattern extending in a first direction;

performing a first removing process that selectively removes the first region with the first mask to form a first groove extending in the first direction, the first removing process removing an upper part of the second region while a remaining part of the second region having a first surface facing upward, and the bottom level of the first groove being higher than the level of the first surface;

forming a first insulating film over the semiconductor substrate, the first insulating film comprising first and second portions, the first portion filling up the first groove, and the second portion covering the second region;

removing the second portion and a part of the first portion while a remaining part of the first portion filling a bottom portion of the first groove;

forming a second insulating film over the semiconductor substrate, the second insulating film filling up the first groove; and partially removing the second insulating film to make the top level of the second insulating film being equal to the top level of the semiconductor substrate.

2. The method according to claim 1, wherein
the second insulating film comprises third and fourth portions,
a third portion covers the first portion,
the third portion fills up the first groove, and
the fourth portion covers the second region.

3. The method according to claim 2, wherein
the first region corresponds to a cell array region, the second region corresponds to a peripheral region, and the method further comprises:
forming a second mask over the first region, the second mask having a second line-and-space pattern extending in a second direction different from the first direction; and
performing a second removing process that selectively removes the third portion with the second mask to form a first trench, the bottom level of the first trench being equal to the top level of the first portion, and the second removing process removing an upper part of the fourth portion while a remaining part of the fourth portion covering the first surface.

4. The method according to claim 3, wherein the first trench has a side surface narrowing downwardly in view of the second direction, and the method further comprises:
selectively removing the second insulating film with the second mask while the first portion and the fourth portion cover a bottom surface of the first groove and the first surface, respectively, to make the side surface of the first trench vertical in view of the second direction.

5. A method of manufacturing a semiconductor device, comprising:
forming first and second grooves in a semiconductor substrate, the first and second grooves extending in a first direction;
forming a first insulating film filling bottom portions of the first and second grooves;
forming a second insulating film over the first insulating film, the second insulating film comprising first and second portions filling up the first and second grooves, respectively; and
selectively removing the second insulating film down to the top level of the first insulating film to form first and second trenches in the first and second portions, respectively, while the first insulating film covers the bottom portions of the first and second grooves,
wherein selectively removing the second insulating film comprises:
forming a mask over the semiconductor substrate and the second insulating film, the mask having a line-and-space pattern extending in a second direction different from the first direction; and
selectively removing the second insulating film with the mask, and
wherein the first and second trenches have side surfaces narrowing downwardly in view of the second direction, and the method further comprises:
selectively removing the second insulating film with the mask to make the side surfaces of the first and second trenches vertical while the first insulating film covers the bottom portions of the first and second grooves.

6. The method according to claim 5, wherein
the semiconductor substrate comprises a third portion extending upwardly between the first and second grooves, and the method further comprises:
partially removing the semiconductor substrate with the mask to lower the top level of the third portion, the top level of a remaining part of the third portion being higher than the top level of the first insulating film.

7. The method according to claim 6, wherein
a third groove is formed with the mask by partially removing the semiconductor substrate, the third groove extending in the second direction,
the third groove crosses the first and second grooves, and the bottom level of the third groove is equal to the top level of the first insulating film.

8. The method according to claim 7, further comprising:
forming a third insulating film covering exposed top and side surfaces of the fifth portion; and
forming a conductive film covering the first to third insulating films, the conductive film filling the third groove and the first and second trenches.

9. The method according to claim 8, further comprising:
partially removing the conductive film to make the top level of a remaining part of the conductive film higher than the top level of the third insulating film and lower than the top level of the semiconductor substrate.

10. The method according to claim 9, further comprising:
forming a fourth insulating film over the conductive film so as to fill up the third groove; and
partially removing the fourth insulating film to make the top level of the fourth insulating film being equal to the top level of the semiconductor substrate.

11. The method according to claim 10, further comprising:
introducing an impurity into the semiconductor substrate to form an impurity region adjacent to a top surface of the semiconductor substrate.

12. A method of manufacturing a semiconductor device, comprising:
preparing a semiconductor substrate having a first region and a second region other than the first region, the first region extending upwardly, the first region having a first groove extending in a first direction, the bottom level of the first groove being higher than the top level of the second region;
forming a first insulating film filling a bottom portion of the first groove;
forming a second insulating film covering the first insulating film and the second region, the top level of the second insulating film being equal to the top level of the semiconductor substrate;
performing a first removing process that selectively removes the second insulating film down to the top level of the first insulating film to form a first trench in the first region, the first trench having a side surface narrowing downwardly in view of a second direction different from the first direction; and
performing a second removing process that selectively removes the second insulating film to make the side surface of the first trench vertical while a remaining part of the second insulating film covers the second region.

13. The method according to claim 12, wherein the first removing process comprises:
forming a first mask over the semiconductor substrate and the second insulating film, the first mask having a first line-and-space pattern extending in the second direction; and
selectively removing the second insulating film with the first mask, and
the second removing process is performed with the first mask.

14. The method according to claim 12, wherein forming the first insulating film comprises:

forming a third insulating film over the semiconductor substrate, the third insulating film comprising first and second portions, the first portion filling up the first groove, and the second portion covering the second region; and removing the second portion and a part of the first portion, a remaining part of the first portion forming the first insulating film.

15. The method according to claim 12, wherein preparing the semiconductor substrate comprises:

forming a second mask over a semiconductor base substrate, the second mask having a second line-and-space pattern extending in the first direction; and selectively removing the semiconductor base substrate with the second mask to form the first and second regions, and a plurality of grooves in the first region, the plurality of grooves comprising the first groove.

16. A method of manufacturing a semiconductor device, comprising:

preparing a semiconductor substrate having a first region and a second region other than the first region, the first region corresponding to a cell array region, and the second region corresponding to a peripheral region;

forming a first mask over the first region, the first mask having a first line-and-space pattern extending in a first direction;

performing a first removing process that selectively removes the first region with the first mask to form a first groove extending in the first direction, the first removing process removing an upper part of the second region while a remaining part of the second region having a first surface facing upward, and the bottom level of the first groove being higher than the level of the first surface;

forming a first insulating film over the semiconductor substrate, the first insulating film comprising first and second portions, the first portion filling up the first groove, and the second portion covering the second region;

removing the second portion and a part of the first portion while a remaining part of the first portion filling a bottom portion of the first groove;

forming a second insulating film over the semiconductor substrate, the second insulating film filling up the first groove and comprising third and fourth portions, a third portion covering the first portion and filling up the first groove, the fourth portion covering the second region;

partially removing the second insulating film to make the top level of the second insulating film be equal to the top level of the semiconductor substrate; and forming a second mask over the first region, the second mask having a second line-and-space pattern extending in a second direction different from the first direction, wherein, the first trench has a side surface narrowing downwardly in view of the second direction, and the method further comprises:

selectively removing the second insulating film with second mask while the first portion and the fourth portion cover a bottom surface of the first groove and the first surface, respectively, to make the side surface of the first trench vertical in view of the second direction.

17. The method according to claim 16, further comprising:

performing a second removing process that selectively removes the third portion with the second mask to form a first trench, the bottom level of the first trench being equal to the top level of the first portion.

18. The method according to claim 17, wherein the second removing process removes an upper part of the fourth portion while a remaining part of the fourth portion covering the first surface.

* * * * *